United States Patent
Sagong et al.

(10) Patent No.: US 11,488,877 B2
(45) Date of Patent: Nov. 1, 2022

(54) SEMICONDUCTOR DEVICE INCLUDING TEST STRUCTURE

(71) Applicant: Samsung Electronics Co., Ltd., Suwon-si (KR)

(72) Inventors: Hyun Chul Sagong, Hwaseong-si (KR); June Kyun Park, Seongnam-si (KR); Hyun Jin Kim, Suwon-si (KR); Ki Hyun Choi, Yongin-si (KR); Sang Woo Pae, Seongnam-si (KR)

(73) Assignee: Samsung Electronics Co., Ltd.

( * ) Notice: Subject to any disclaimer, the term of this patent is extended or adjusted under 35 U.S.C. 154(b) by 502 days.

(21) Appl. No.: 16/191,881

(22) Filed: Nov. 15, 2018

(65) Prior Publication Data

US 2019/0326187 A1    Oct. 24, 2019

(30) Foreign Application Priority Data

Apr. 20, 2018 (KR) .................. 10-2018-0045988

(51) Int. Cl.
*H01L 21/66* (2006.01)
*H01L 27/088* (2006.01)
*H01L 27/11* (2006.01)
*H01L 29/78* (2006.01)

(52) U.S. Cl.
CPC .......... *H01L 22/30* (2013.01); *H01L 27/0886* (2013.01); *H01L 27/1104* (2013.01); *H01L 29/7851* (2013.01)

(58) Field of Classification Search
CPC .................. H01L 22/30–34; H01L 27/0886
See application file for complete search history.

(56) References Cited

U.S. PATENT DOCUMENTS

| 6,924,886 B2 | 8/2005 | Yang | |
|---|---|---|---|
| 9,121,890 B2 | 9/2015 | Gu et al. | |
| 2013/0299947 A1* | 11/2013 | Uehling | H01L 22/20 257/620 |
| 2014/0339559 A1* | 11/2014 | Su | H01L 22/34 257/48 |
| 2015/0076498 A1* | 3/2015 | Yamashita | G03F 7/70466 257/48 |
| 2015/0076499 A1* | 3/2015 | Wann | H01L 22/32 257/48 |

(Continued)

FOREIGN PATENT DOCUMENTS

| JP | 08-248620 | 9/1996 |
|---|---|---|
| KR | 10-0328361 | 3/2002 |
| KR | 10-2006-0033122 | 4/2006 |

*Primary Examiner* — Eric K Ashbahian
(74) *Attorney, Agent, or Firm* — Myers Bigel, P.A.

(57) ABSTRACT

A semiconductor device including a test structure includes a semiconductor substrate and a plurality of test structures on the semiconductor substrate. The test structures include respective lower active regions extending from the semiconductor substrate in a vertical direction and having different widths, and upper active regions extending from respective lower active regions in the vertical direction. Each of the lower active regions includes first regions and second regions. The first regions overlap the upper active regions and are between the second regions, and the second regions include outer regions and inner regions between the outer regions. The outer regions, located in the lower active regions having different widths, have different widths.

19 Claims, 32 Drawing Sheets

(56) References Cited

U.S. PATENT DOCUMENTS

2016/0069792 A1* 3/2016 O'Mullane .......... G01N 21/956
  356/364
2016/0351565 A1* 12/2016 Sung .................. H01L 29/7846
2017/0084507 A1 3/2017 Ie et al.
2017/0192050 A1 7/2017 Lei
2017/0373058 A1* 12/2017 Tsau .................. H01L 29/66545
2018/0040703 A1* 2/2018 Chang ............... H01L 29/66795

* cited by examiner

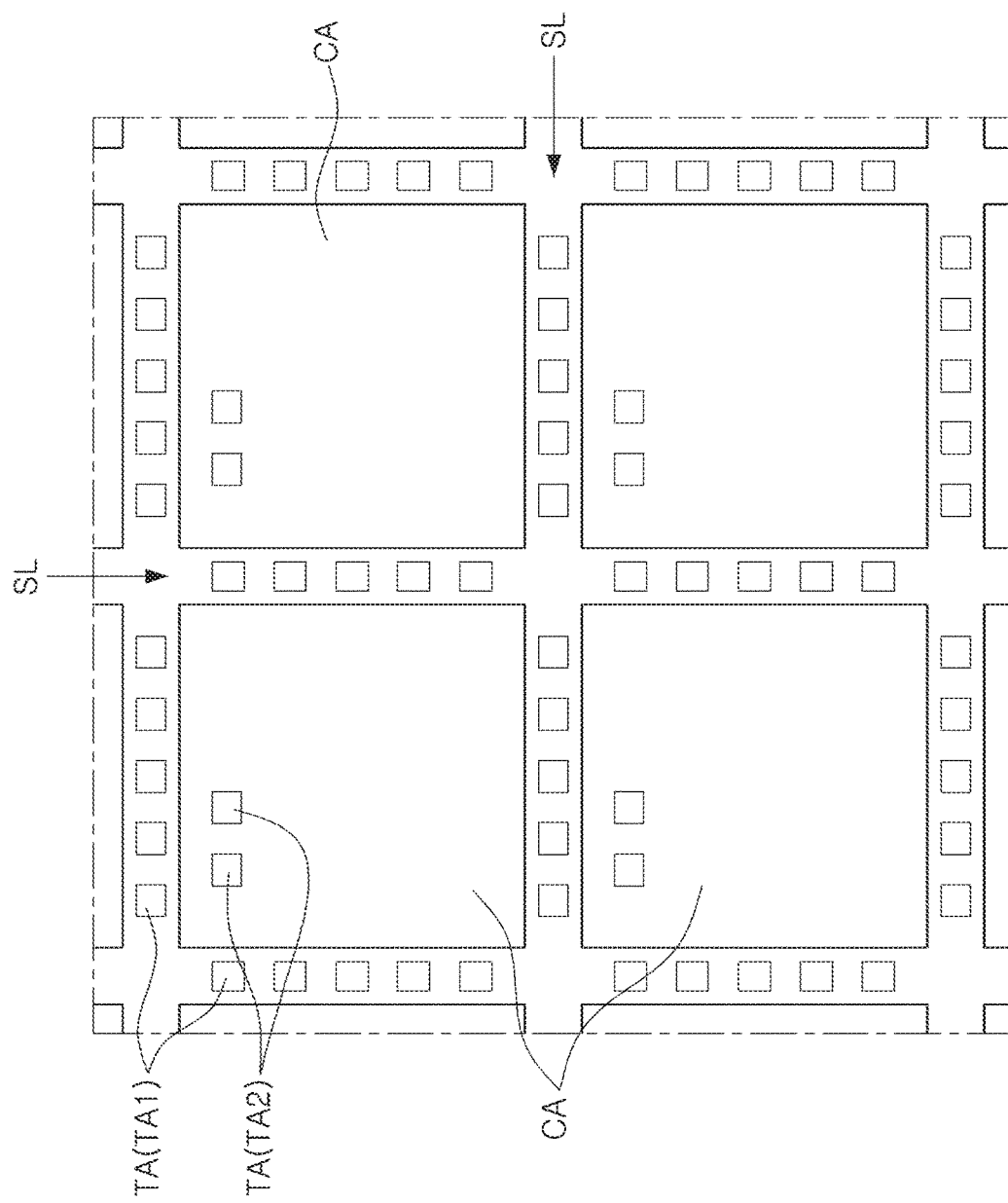

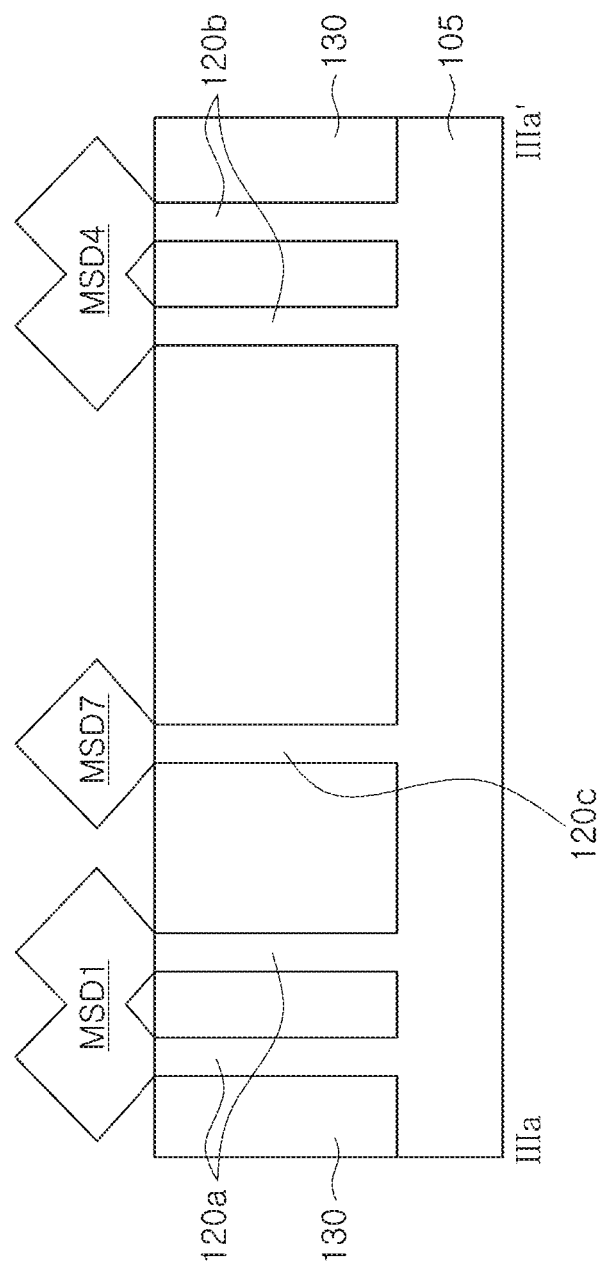

SEMICONDUCTOR DEVICE INCLUDING TEST STRUCTURE

CROSS-REFERENCE TO RELATED APPLICATION(S)

This application claims benefit of priority to Korean Patent Application No. 10-2018-0045988 filed on Apr. 20, 2018 in the Korean Intellectual Property Office, the disclosure of which is incorporated herein by reference in its entirety.

FIELD

The present inventive concepts relate to semiconductor devices, and more particularly, to semiconductor devices including test structures.

BACKGROUND

In order to manufacture semiconductor devices, integrated circuits may be formed on a semiconductor wafer. To determine the failure or reliability of such integrated circuits, the electrical characteristics of the integrated circuits may be measured. For example, a test element group (TEG) having a structure the same as that of an integrated circuit may be formed in a scribe lane region of a semiconductor wafer.

SUMMARY

An aspect of the present inventive concepts is to provide a semiconductor device including test structures configured to or for providing or indicating an optimal or desirable area of an active region.

An aspect of the present inventive concepts is to provide a semiconductor device including test structures configured to or for detecting whether there is a leakage current defect or a reliability defect between source/drain regions having different types of conductivity.

According to an aspect of the present inventive concepts, a semiconductor device is provided. The semiconductor device includes: a semiconductor substrate; and a plurality of test structures formed on the semiconductor substrate. The test structures include lower active regions extended from the semiconductor substrate in a vertical direction and having different widths and upper active regions extended from respective lower active regions in the vertical direction, each of the lower active regions includes first regions and second regions, the first regions overlap the upper active regions and are disposed between the second regions, the second regions include outer regions and inner regions between the outer regions, and the outer regions, located in the lower active regions having different widths, have different widths.

According to an aspect of the present inventive concepts, a semiconductor device is provided. The semiconductor device includes: a semiconductor substrate; and a plurality of test structures formed on the semiconductor substrate. The plurality of test structures include: lower active regions extended from the semiconductor substrate in a vertical direction, perpendicular to the semiconductor substrate, and having different widths; upper active regions extended from each of the lower active regions in the vertical direction, and extended in a first horizontal direction, parallel to the vertical direction; and gate structures extended in a second horizontal direction, perpendicular to the first horizontal direction, and having portions overlapping the lower active regions and the upper active regions, each of the lower active regions, having different widths, includes first regions overlapping the upper active regions, and second regions not overlapping the upper active regions, and the second regions include outer regions and inner regions between the outer regions.

According to an aspect of the present inventive concepts, a semiconductor device is provided. The semiconductor device includes: a memory cell array region including a unit memory cell region; and a test region including a unit test region having a planar size equal to a planar size of the unit memory cell region. The unit memory cell region includes: a pair of first memory active lines adjacent to each other while intersecting the unit memory cell region; a pair of second memory active lines adjacent to each other while intersecting the unit memory cell region; a single third memory active line disposed between the pair of first memory active lines and the pair of second memory active lines; and a single fourth memory active line disposed between the pair of first memory active lines and the pair of second memory active lines. The unit test region includes: a pair of first test active lines adjacent to each other while intersecting the unit test region; a pair of second test active lines adjacent to each other while intersecting the unit test region; a single third test active line adjacent to the pair of first test active lines; and a single fourth test active line adjacent to the pair of second test active lines. Each of the third and fourth memory active lines has an end portion in the unit memory cell region. Each portion of the third and fourth test active lines intersects the unit test region.

BRIEF DESCRIPTION OF DRAWINGS

The above and other aspects, features and other advantages of the present disclosure will be more clearly understood from the following detailed description, taken in conjunction with the accompanying drawings, in which:

FIG. 2 is a partially enlarged view of a portion of FIG. 1;

FIGS. 14A and 14B are cross-sectional views illustrating a portion of a semiconductor device according to some example embodiments;

DETAILED DESCRIPTION

Hereinafter, example embodiments of the present disclosure will be described in detail with reference to the accompanying drawings.

Figure 1:
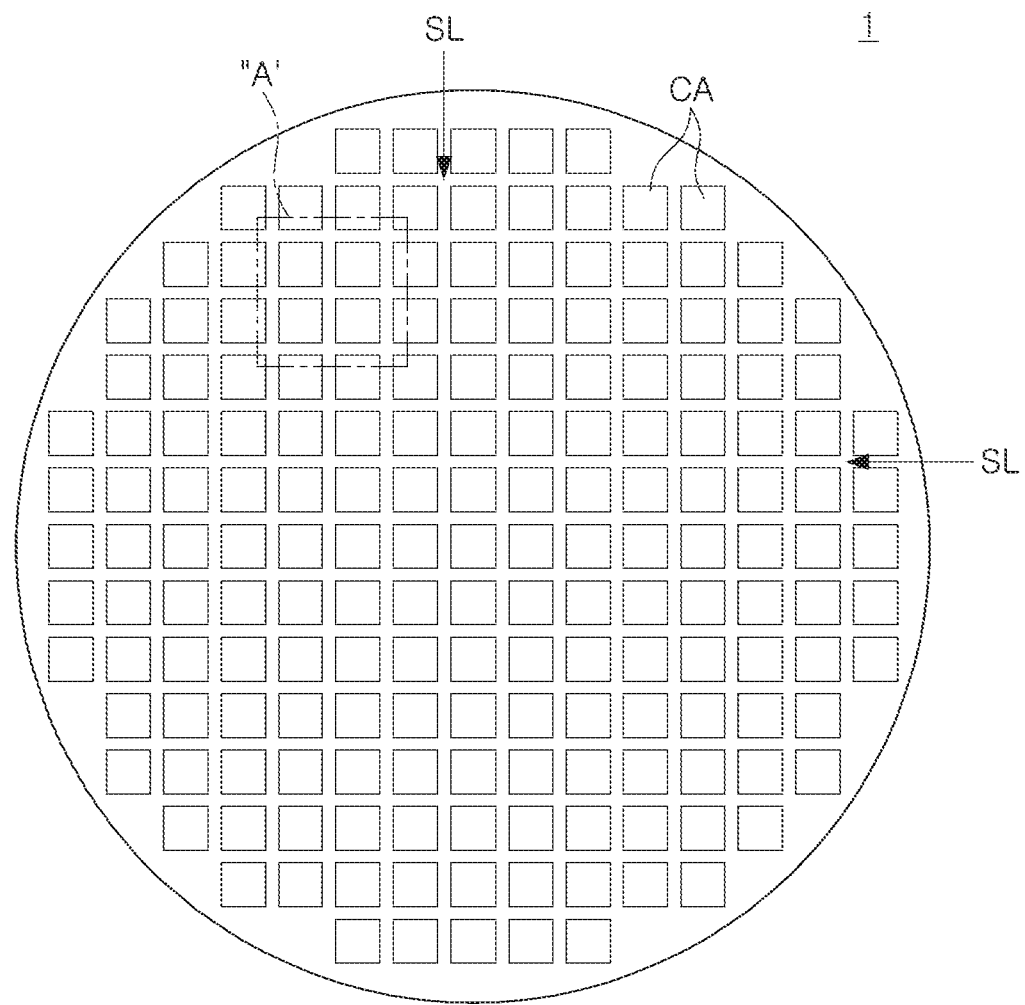
FIG. 1 is a plan view illustrating a semiconductor device according to some example embodiments.

FIG. 1 is a plan view illustrating of a semiconductor device according to some example embodiments, while FIG. 2 is a partially enlarged view of portion 'A' of FIG. 1.

Referring to FIGS. 1 and 2, a semiconductor device 1 according to some example embodiments may include a plurality of chip regions CA and a scribe lane region SL between the chip regions CA. In one example, each of the chip regions CA may have, when viewed in plan view, a quadrangular shape.

The semiconductor device 1 according to some example embodiments may include test regions TA. In one example, the test regions TA may include first test regions TA1 in the scribe lane region SL. In another example, the test regions TA may include second test regions TA2 in the chip region CA. In another example, the test regions TA may include the first test regions TA1 in the scribe lane region SL and the second test regions TA2 in the chip regions CA. The terms first, second, third, etc. are used herein merely to distinguish or differentiate one element (e.g., layer, transistor, etc.) from another.

The test regions TA may be regions in which test structures for testing physical and/or electrical characteristics of various elements forming the semiconductor device 1 according to some example embodiments are to be formed. For example, the semiconductor device 1 according to some example embodiments may include elements such as active regions, gate electrodes, source/drain regions, and wirings, while the test regions TA may be regions in which test structures for testing one or more of the elements described above are to be formed.

The semiconductor device 1 according to some example embodiments may be provided as a semi-finished product in a state of a semiconductor wafer. Moreover, the semiconductor device 1 according to some example embodiments may be provided as a semiconductor package or a semiconductor chip, processed into the form of a package by performing a packaging process on a semi-finished product in a state of a semiconductor wafer.

Hereinafter, examples of test structures which are to be formed in the test regions TA described above will be described. The test structures according to an example described below may be formed in the first test regions TA1, formed in the second test regions TA2, or formed in the first test regions TA1 and the second test regions TA2.

Figure 3A:
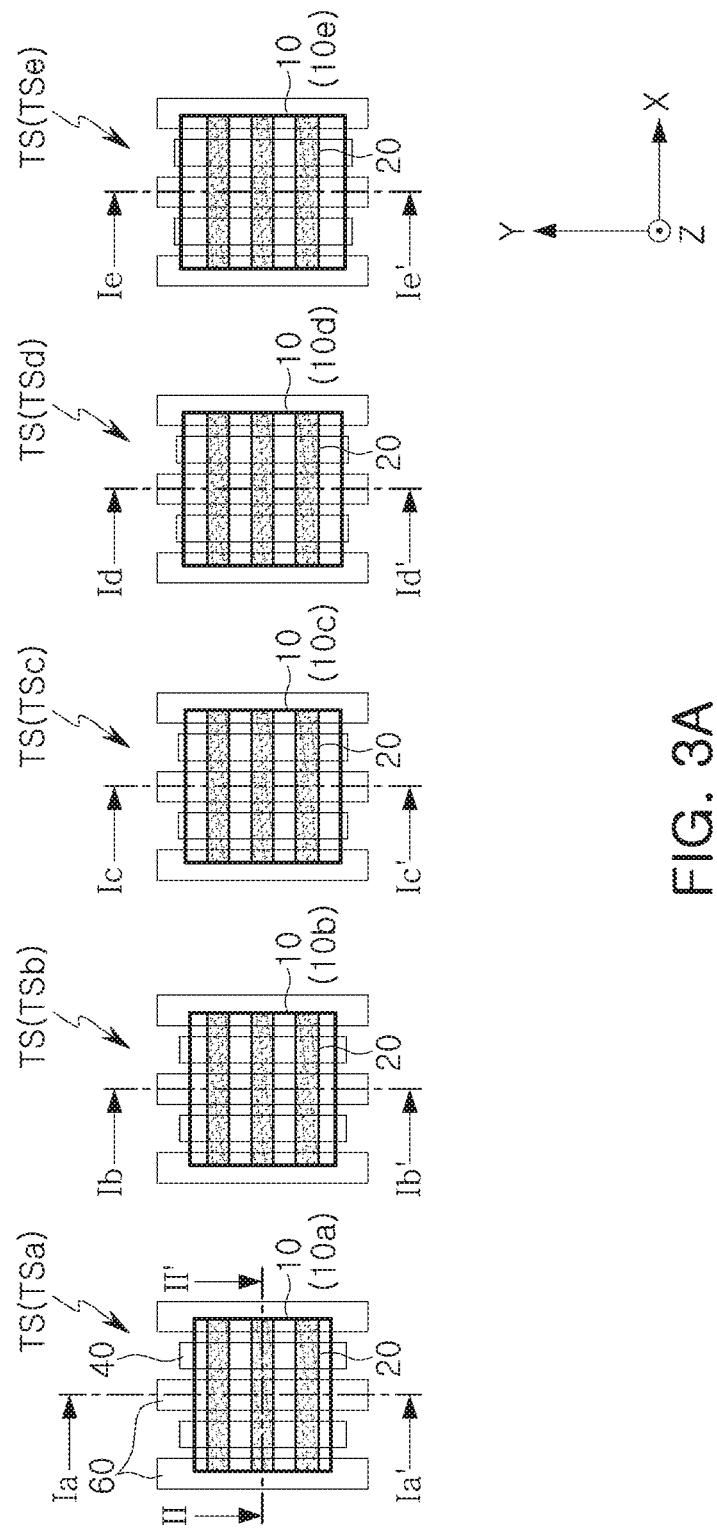
FIGS. 3A to 3C are plan views illustrating an example of a test structure of a semiconductor device according to some example embodiments.
Figure 3B:
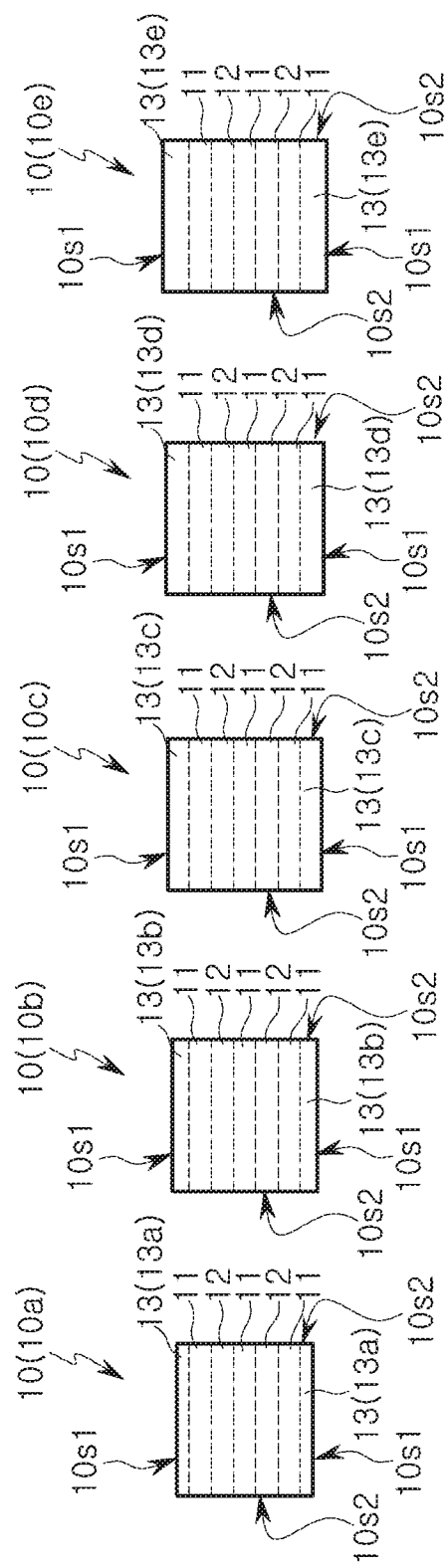
Figure 3C:
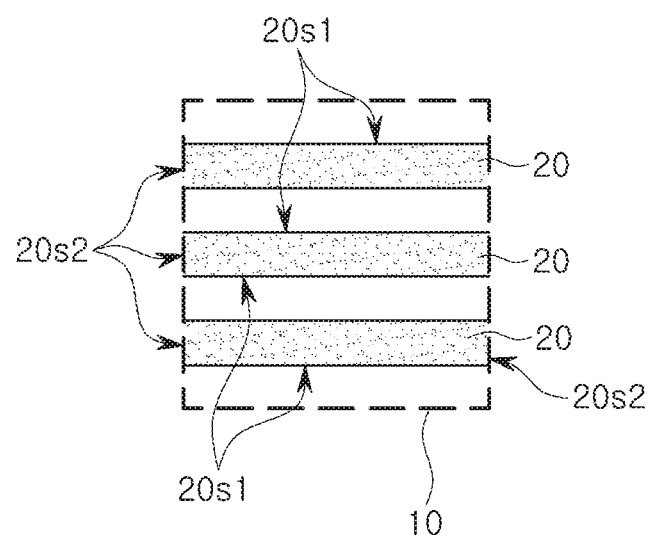
Figure 4A:
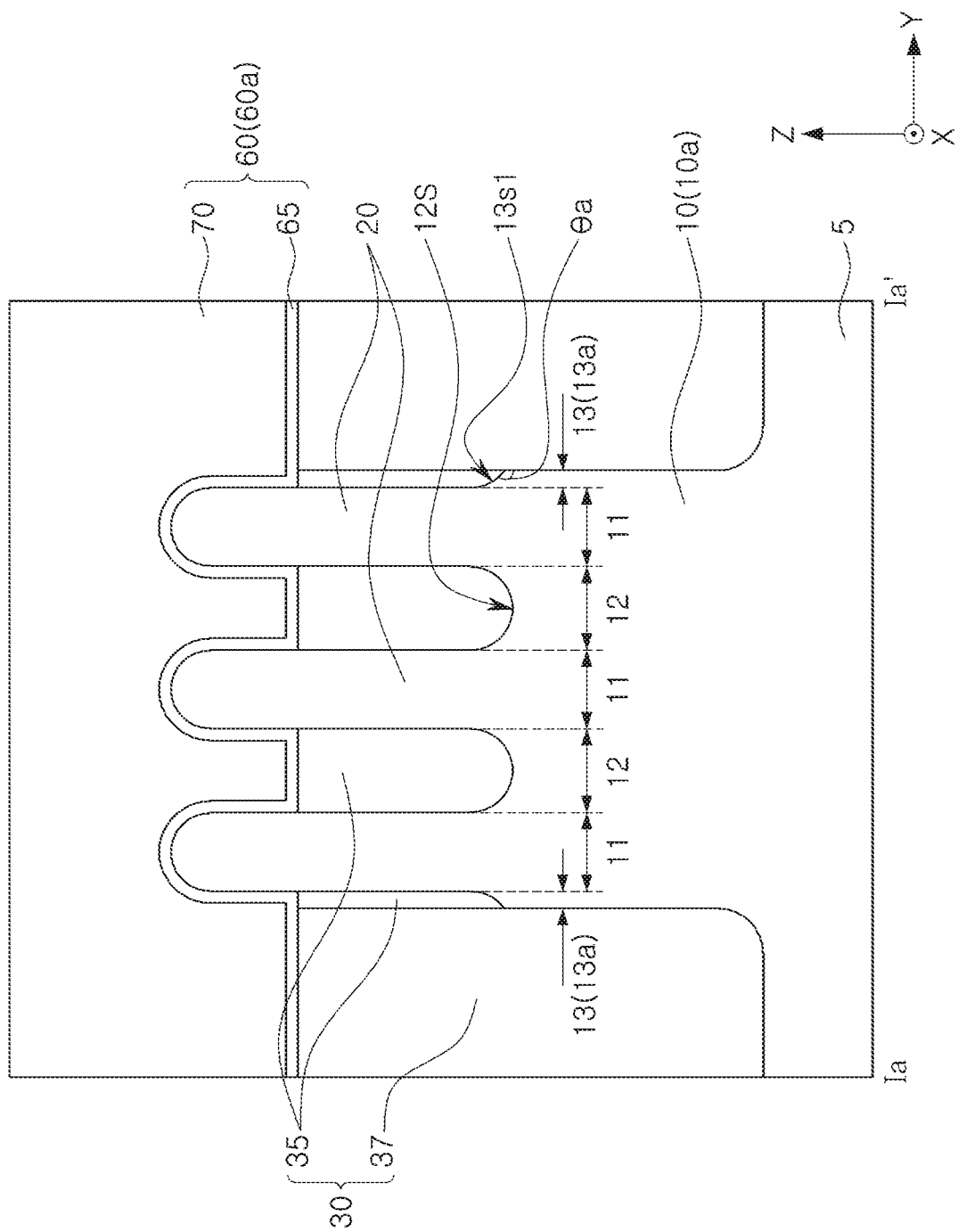
FIGS. 4A to 5 are cross-sectional views illustrating an example of a test structure of a semiconductor device according to some example embodiments.
Figure 4B:
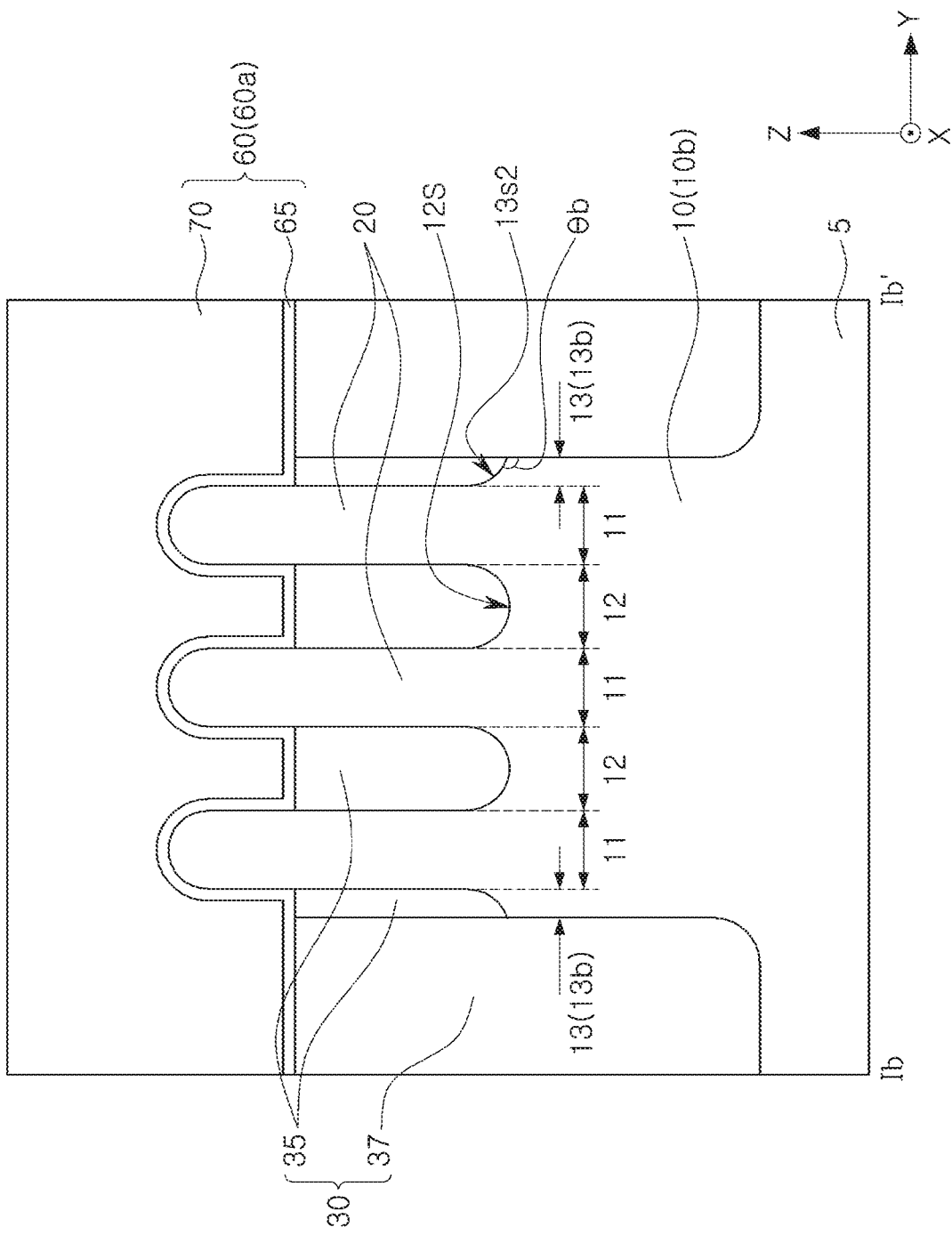
Figure 4C:
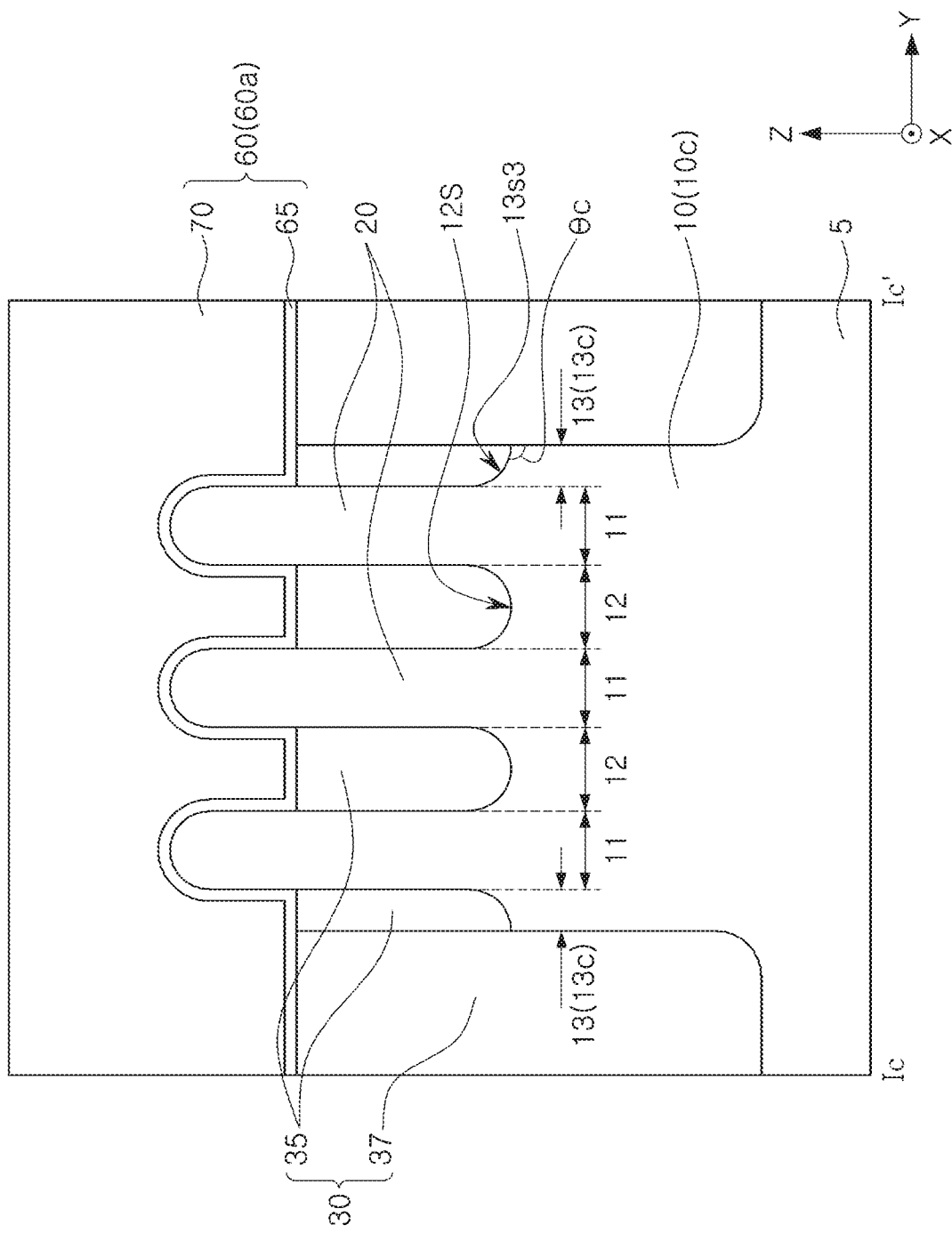
Figure 4D:
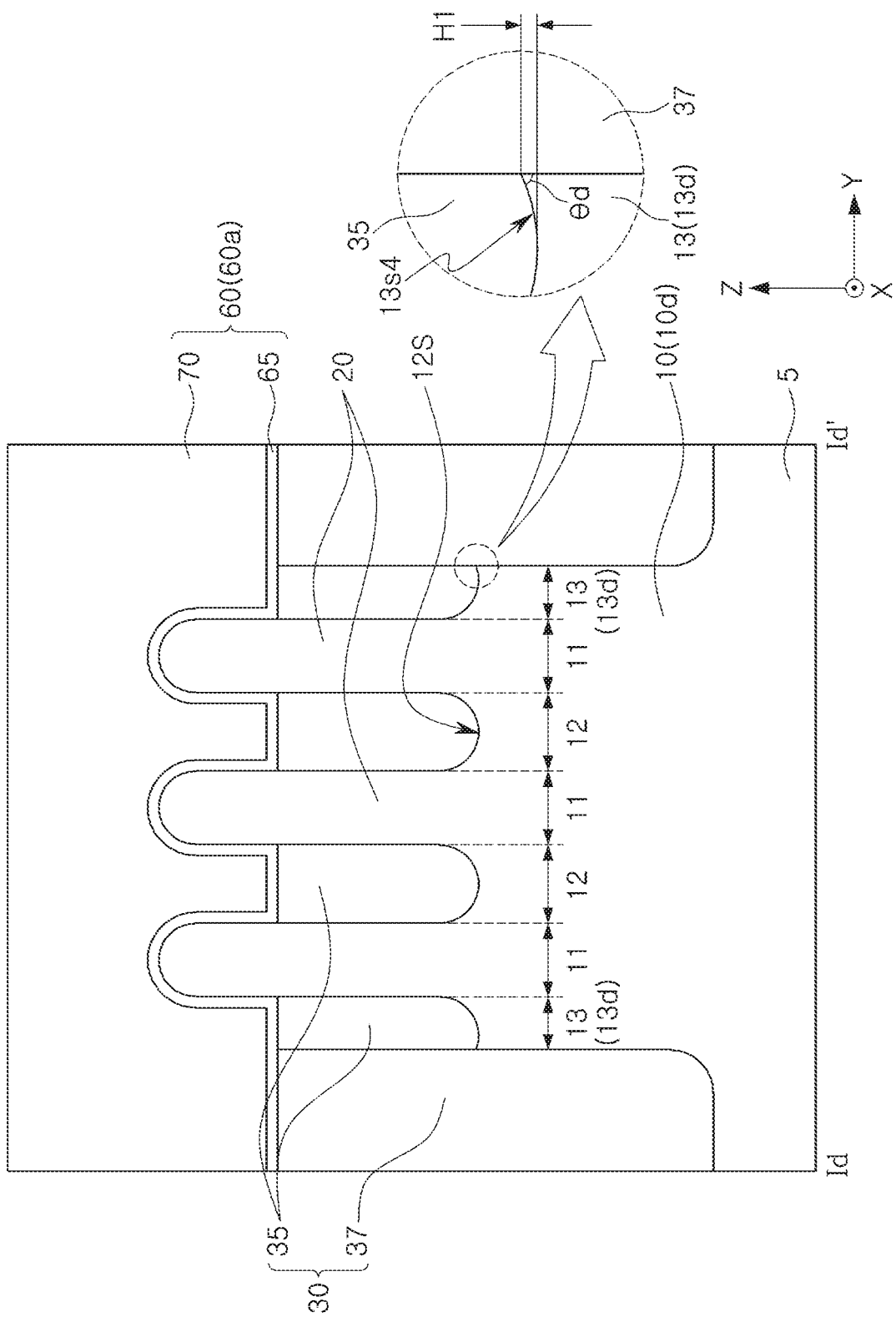
Figure 4E:
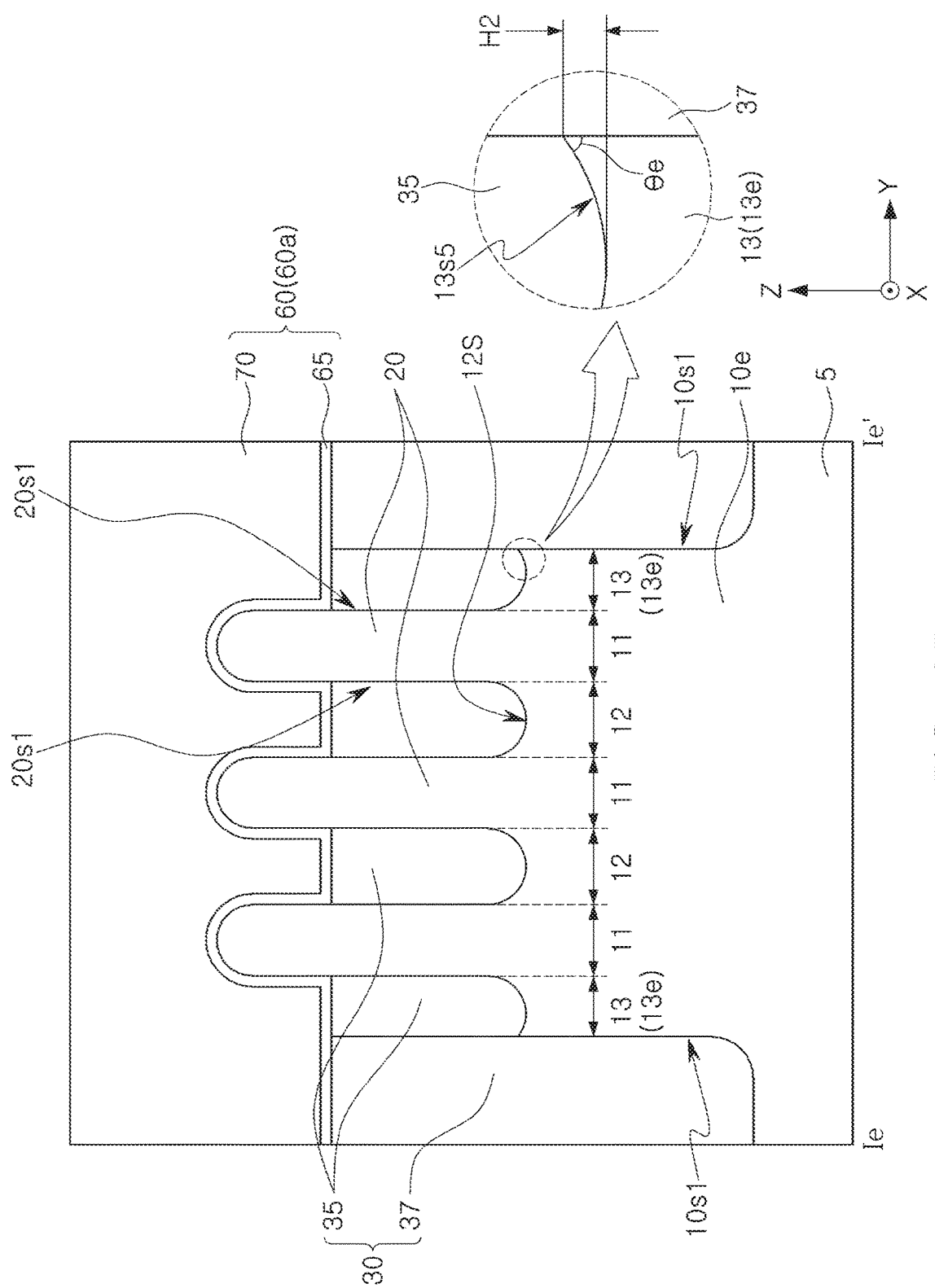
Figure 5:
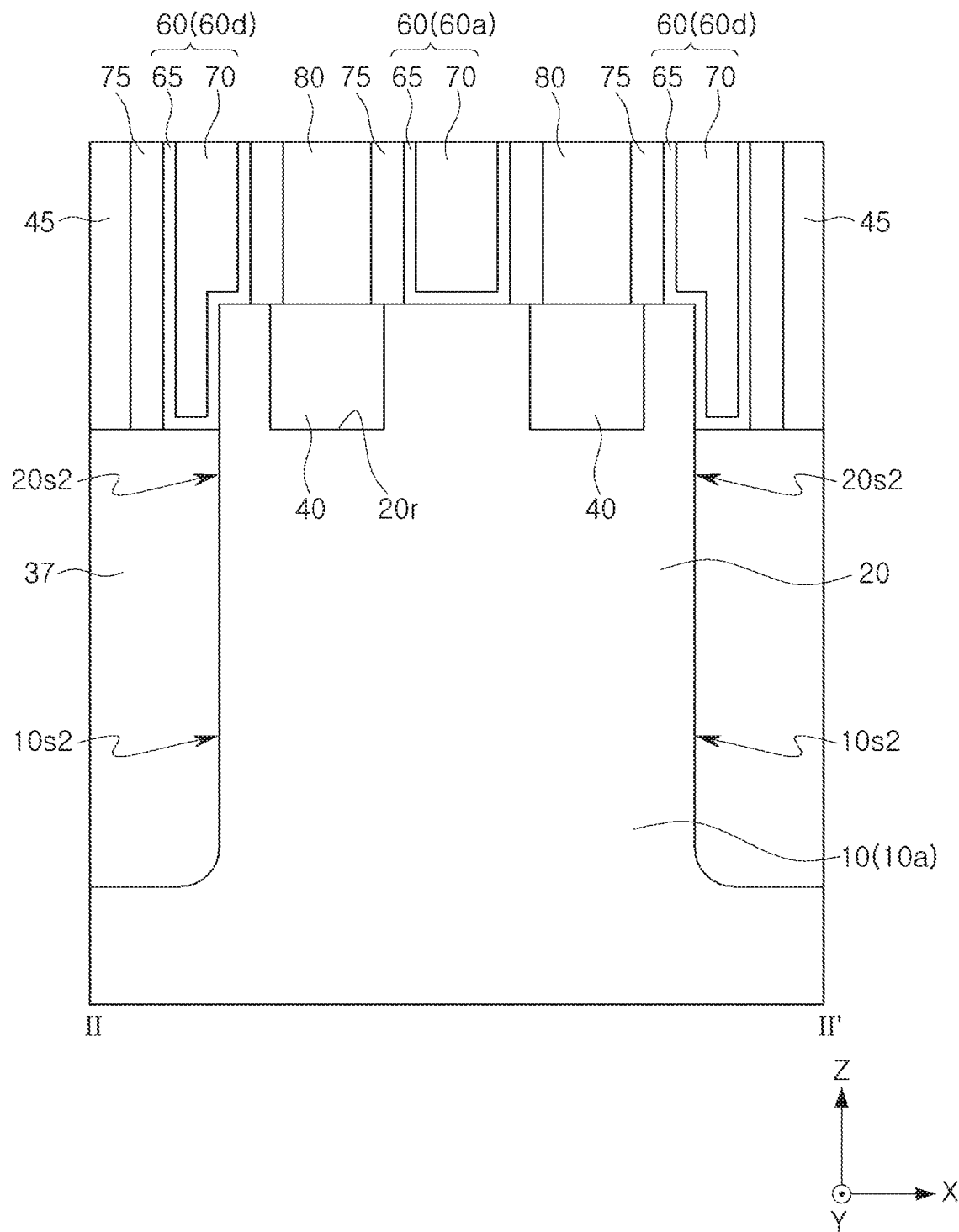

With reference to FIGS. 3A to 5, an example of test structures of the semiconductor device 1 according to some example embodiments will be described. In FIGS. 3A to 5, FIG. 3A is a plan view illustrating test structures, FIG. 3B is a plan view illustrating lower active regions 10 of FIG. 3A, FIG. 3C is a plan view illustrating an upper active region 20 of FIG. 3A, FIG. 4A is a cross-sectional view illustrating a region taken along line Ia-Ia' of FIG. 3A, FIG. 4B is a cross-sectional view illustrating a region taken along line Ib-Ib' of FIG. 3A, FIG. 4C is a cross-sectional view illustrating a region taken along line Ic-Ic' of FIG. 3A, FIG. 4D is a cross-sectional view illustrating a region taken along line Id-Id' of FIG. 3A, FIG. 4E is a cross-sectional view illustrating a region taken along line Ie-Ie' of FIG. 3A, and FIG. 5 is a cross-sectional view illustrating a region taken along line II-II' of FIG. 3A.

Referring to FIGS. 3A to 5, together with FIGS. 1 and 2, the semiconductor device 1 according to some example embodiments may include a plurality of test structures TS. The test structures TS may be formed on a semiconductor substrate 5.

The test structures TS may include lower active regions 10 extended from the semiconductor substrate 5 in a vertical direction Z, and upper active regions 20 extended from each of the lower active regions 10 in the vertical direction Z and extended in a first horizontal direction X, perpendicular to the vertical direction Z. The vertical direction Z may be a direction perpendicular to the semiconductor substrate 5.

In example embodiments, the 'upper active region' may be referred to as the 'upper active line' or 'upper active fin'. The lower active regions 10 may be distinct from one another, that is, each lower active region 10 may separately protrude from the substrate 5.

Each of the test structures TS may include a single lower active region 10 formed on the semiconductor substrate 5 and extended from the semiconductor substrate 5 in the vertical direction Z, and a plurality of upper active regions 20 extended from the single lower active region 10 in the vertical direction Z. As illustrated, each lower active region 10 may include a same number or quantity of upper active regions 20 in some embodiments.

The test structures TS may include lower active regions 10 having different sizes, for example, different widths, and each of the lower active regions 10 having different widths may include first regions 11 and second regions 12 and 13. It will be understood that the different widths and/or other sizes described herein refer to measurable differences that exceed production tolerances for the respective lower active regions 10. In particular, the variance in the different widths of the lower active regions 10 of the test structures TS may be outside of the range of acceptable variances in widths among lower active regions of memory cells or other circuit structures as described herein. The first regions 11 may overlap the upper active regions 20 and may be disposed between the second regions 12 and 13. The second regions 12 and 13 may include outer regions 13 and inner regions 12 between the outer regions 13. The outer regions 13 located in the single lower active region 10 may have the same width, while the outer regions 13 located in the lower active regions 10 having different sizes may have different widths. That is, the respective widths of the outer regions or edges 13 of each lower active region 10 may be measurably different from one another, and may contribute to the differences in the respective overall widths of each of the lower active regions 10.

In one example, the inner regions 12 located in the lower active regions 10 having different widths may have the same width.

In one example, the first regions 11 located in the lower active regions 10 having different sizes may have the same width.

Each of the lower active regions 10 may have first side surfaces (10s1 of FIG. 3B), opposing each other, and second side surfaces (10s2 of FIG. 3B), opposing each other. Moreover, each of the upper active regions 20 may have first side surfaces (20s1 of FIG. 3C), opposing each other, and second side surfaces (20s2 of FIG. 3C), opposing each other. The second side surfaces 20s2 of the upper active regions 20 may be aligned with the second side surfaces 10s2 of the lower active regions 10, and the first side surfaces 20s1 of the upper active regions 20 may be located on the lower active regions 10.

In an example, the plurality of test structures TS may include a first test structure TSa, a second test structure TSb, a third test structure TSc, a fourth test structure TSd, and a fifth test structure TSe.

In this specification, for convenience of explanation, the plurality of test structures TS are described as five test structures, such as the first to fifth test structures TSa, TSb, TSc, TSd, and TSe, by way of example. However, the inventive concepts described herein are not limited thereto, and the plurality of test structures TS may further include more than five test structures. Thus, in the following description, the first to fifth test structures TSa, TSb, TSc, TSd, and TSe will be described below, but the inventive concepts described herein are not limited thereto.

The first test structure TSa may include a first lower active region 10a extended from the semiconductor substrate 5 in the vertical direction Z and the upper active regions 20 extended from the first lower active region 10a in the vertical direction Z. The second test structure TSb may include a second lower active region 10b extended from the semiconductor substrate 5 in the vertical direction Z and the upper active regions 20 extended from the second lower active region 10b in the vertical direction Z. The third test structure TSc may include a third lower active region 10c extended from the semiconductor substrate 5 in the vertical direction Z and the upper active regions 20 extended from the third lower active region 10c in the vertical direction Z. The fourth test structure TSd may include a fourth lower active region 10d extended from the semiconductor substrate 5 in the vertical direction Z and the upper active regions 20 extended from the fourth lower active region 10d in the vertical direction Z. The fifth test structure TSe may include a fifth lower active region 10e extended from the semiconductor substrate 5 in the vertical direction Z and the upper active regions 20 extended from the fifth lower active region 10e in the vertical direction Z.

The first to fifth test structures TSa, TSb, TSc, TSd, and TSe, having different widths, may include the first to fifth lower active regions 10a, 10b, 10c, 10d, and 10e, having different widths. Each of the first to fifth lower active regions 10a, 10b, 10c, 10d, and 10e may include the first regions 11 and the second regions 12 and 13, as described previously.

In example embodiments, the 'first regions 11' may be referred to as the 'overlap regions 11', and the 'second regions 12 and 13' may be referred to as the 'non-overlap regions 12 and 13'. Thus, the first regions 11 of the first to fifth lower active regions 10a, 10b, 10c, 10d, and 10e may be referred to as overlap regions, overlapping the upper active regions 20 (e.g., in plan view), while the first regions 11 of the first to fifth lower active regions 10a, 10b, 10c, 10d, and 10e may be referred to as non-overlap regions, not overlapping the upper active regions 20 (e.g., in plan view).

Among the second regions 12 and 13 of the lower active regions 10, the upper surfaces 12S of the inner regions 12 may have a curvature in a downward direction. In other words, the upper surfaces 12S of the inner regions 12 may be rounded in a concave form.

The inner regions 12 of the second regions 12 and 13, located in the lower active regions 10 having different widths, have the same first width, while the outer regions 13 of the second regions 12 and 13, located in the lower active regions 10 having different widths, may have different widths within a range greater than 0 and less than the first width.

One lower active region among the lower active regions 10 may have an upper surface of an outer region, forming a first angle with a side surface, another lower active region among the lower active regions 10 may have an upper surface of an outer region, forming a second angle with a side surface, and the first angle may be different from the second angle.

Upper surfaces 13s1 of the first outer regions 13a, of or among the second regions 12 and 13 of the first lower active region 10a, may form a first angle θa with a side surface of the first lower active region 10a. Upper surfaces 13s2 of the second outer regions 13b, of or among the second regions 12 and 13 of the second lower active region 10b, may form a second angle θb with a side surface of the second lower active region 10b. Upper surfaces 13s3 of the third outer regions 13c, of or among the second regions 12 and 13 of the third lower active region 10c, may form a third angle θc with a side surface of the third lower active region 10c. Upper surfaces 13s4 of the fourth outer regions 13d, of or among the second regions 12 and 13 of the fourth lower active region 10d, may form a fourth angle θd with a side surface of the fourth lower active region 10d. Upper surfaces 13s5 of the fifth outer regions 13e, of or among the second regions 12 and 13 of the fifth lower active region 10e, may form a fifth angle Oe with a side surface of the fifth lower active region 10e.

The first to fifth outer regions 13a, 13b, 13c, 13d, and 13e, described above, may have different widths. For example, from the first outer region 13a to the second to fifth outer regions 13b, 13c, 13d, and 13e, a width thereof may increase in sequence. In other words, a width of the fifth outer region 13e may be greater than a width of the first outer region 13a.

The first to fifth angles θa, θb, θc, θd, and θe, described above, may be different angles. For example, from the first angle θa to the second, third, fourth, and fifth angles θa, θb, θc, θd, and θe, an angle may decrease in sequence. For example, the first angle θa and the second angle θb may be an obtuse angle, the third angle θc may be close to a right angle, and the fourth angle θd and the fifth angle θe may be an acute angle.

The outer regions 13d and 13e of at least one of the second regions 12 and 13 located in the lower active regions 10 having different widths may have ends with different heights. For example, a level of the fourth outer region (13d of FIG. 4D) is gradually increased in a direction toward the second isolation region 37 from a low region of an upper surface 13s4 of the fourth outer region (13d of FIG. 4D) to be increased to a first height H1, while a level of the fifth outer region (13e of FIG. 4E) is gradually increased in a direction toward the second isolation region 37 from a low region of an upper surface 13s5 of the fifth outer region (13e of FIG. 4E) to be increased to a second height H2 greater than the first height H1.

The test structures TS may include gate structures 60 in which a plurality of gate structures may overlap each of the lower active regions 10, and source/drain regions 40 formed in the upper active regions 20 located next to the gate structures 60. Each of the gate structures 60 may include a gate electrode 70 and a gate dielectric 65 extending on or covering a lower surface and a side surface of the gate electrode 70.

The gate structures 60 may include an active gate structure 60a intersecting the upper active regions 20 while overlapping the lower active regions 10 and dummy gate structures 60d disposed on both sides of the active gate structure 60a while extending on or covering ends of the upper active regions 20. The upper active regions 20 may protrude from an upper portion of the first isolation region 35 while passing through the first isolation region 35, and the gate structures 60 may extend on or cover upper surfaces and side surfaces of the upper active regions 20 protruding from the upper portion of the first isolation region 35.

The gate structures 60 may be extended in a second horizontal direction Y, perpendicular to the vertical direction Z and perpendicular to the first horizontal direction X, in a portion overlapping or adjacent to the lower active regions 10. Thus, the gate structures 60 may be extended in a direction intersecting the upper active regions 20, that is, the second horizontal direction Y, while overlapping the upper active regions 20. When an element or layer is referred to herein as being "on" or "adjacent" or "coupled to" or "in contact with" another element or layer, intervening elements or layers may be present. In contrast, the terms "directly on" or "directly adjacent" or "directly coupled" or "in direct contact with" may mean that there are no intervening elements or layers present.

In example embodiments, the first horizontal direction X may be understood as a longitudinal direction of the upper active regions 20, and the second horizontal direction Y may be understood as a longitudinal direction of the gate structures 60 on the lower active regions 10.

The source/drain regions 40 may be disposed on the upper active regions 20, and may be disposed between the gate structures 60, when viewed in plan view. The source/drain regions 40 may be provided as an epitaxial semiconductor layer grown from recess regions 20r of the upper active regions 20.

Insulative spacers 75 may be formed on side surfaces of the gate structures 60. Conductive contact plugs 80, electrically connected to the source/drain regions 40, may be formed between the gate structures 60. An interlayer insulating layer 45 may be formed on the second isolation region 37.

Figure 6:
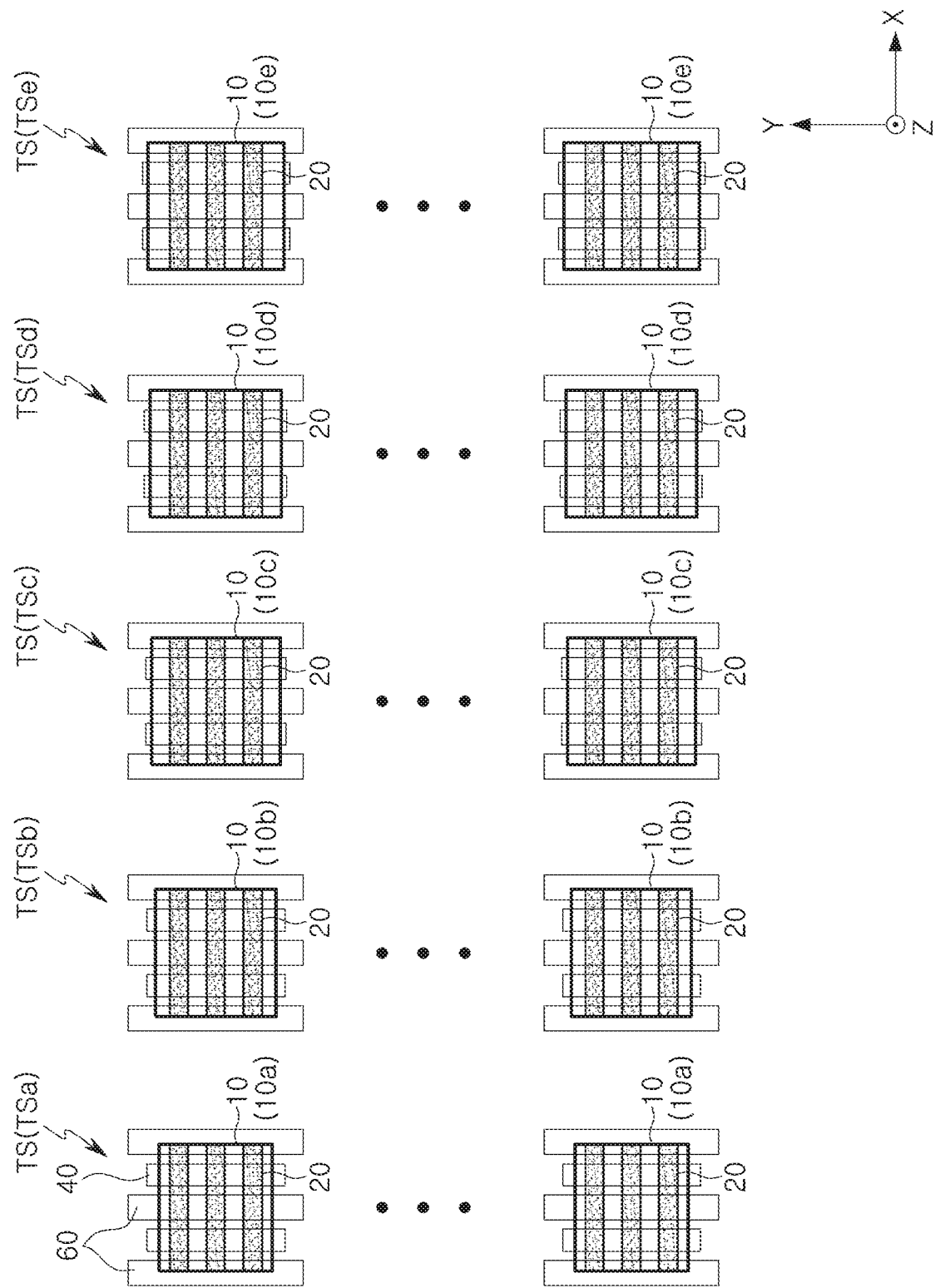
FIG. 6 is a plan view illustrating an example of a test structure of a semiconductor device according to some example embodiments.

As described previously, the first to fifth test structures TSa, TSb, TSc, TSd, and TSe may be provided, respectively, but the inventive concepts described herein are not limited thereto. Examples of an array or arrangement of the first to fifth test structures TSa, TSb, TSc, TSd, and TSe will be described with reference to each of FIGS. 6 and 7. FIG. 6 is a plan view illustrating an example of test structures of a semiconductor device according to some example embodiments, while FIG. 7 is a plan view illustrating a modified example of test structures of a semiconductor device according to some example embodiments.

In one example, referring to FIG. 6, each of the first to fifth test structures TSa, TSb, TSc, TSd, and TSe may be provided as a plurality of test structures arranged adjacent to each other in the second horizontal direction Y, that is, a width direction of the upper active regions 20 or a longitudinal direction of the gate structures 60. Thus, the test structures TS may include the first test structures TSa provided as a plurality of first test structures arranged in the second horizontal direction Y, the second test structures TSb provided as a plurality of second test structures arranged in the second horizontal direction Y, the third test structures TSc provided as a plurality of third test structures arranged in the second horizontal direction Y, the fourth test structures TSd provided as a plurality of fourth test structures arranged in the second horizontal direction Y, and the fifth test structures TSe provided as a plurality of fifth test structures arranged in the second horizontal direction Y.

Figure 7:
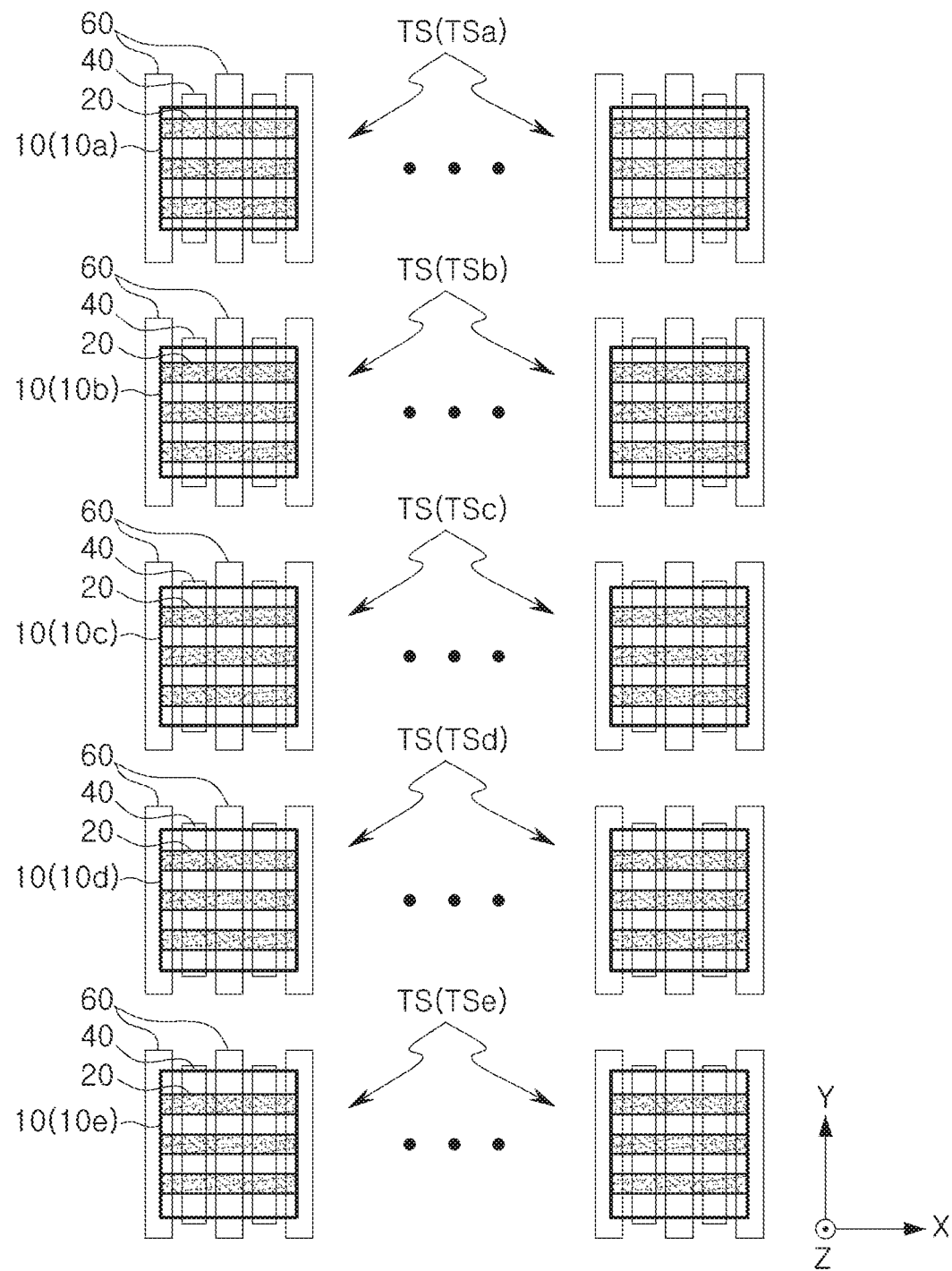
FIG. 7 is a plan view illustrating a modified example of test structures of a semiconductor device according to some example embodiments.

In a modified example, referring to FIG. 7, each of the first to fifth test structures TSa, TSb, TSc, TSd, and TSe may be provided as a plurality of test structures arranged adjacent to each other in the first horizontal direction X, that is, a longitudinal direction of the upper active regions 20. Thus, the test structures TS may include the first test structures TSa provided as a plurality of first test structures arranged in the first horizontal direction X, the second test structures TSb provided as a plurality of second test structures arranged in the first horizontal direction X, the third test structures TSc provided as a plurality of third test structures arranged in the first horizontal direction X, the fourth test structures TSd provided as a plurality of fourth test structures arranged in the first horizontal direction X, and the fifth test structures TSe provided as a plurality of fifth test structures arranged in the first horizontal direction X.

Figure 8A:
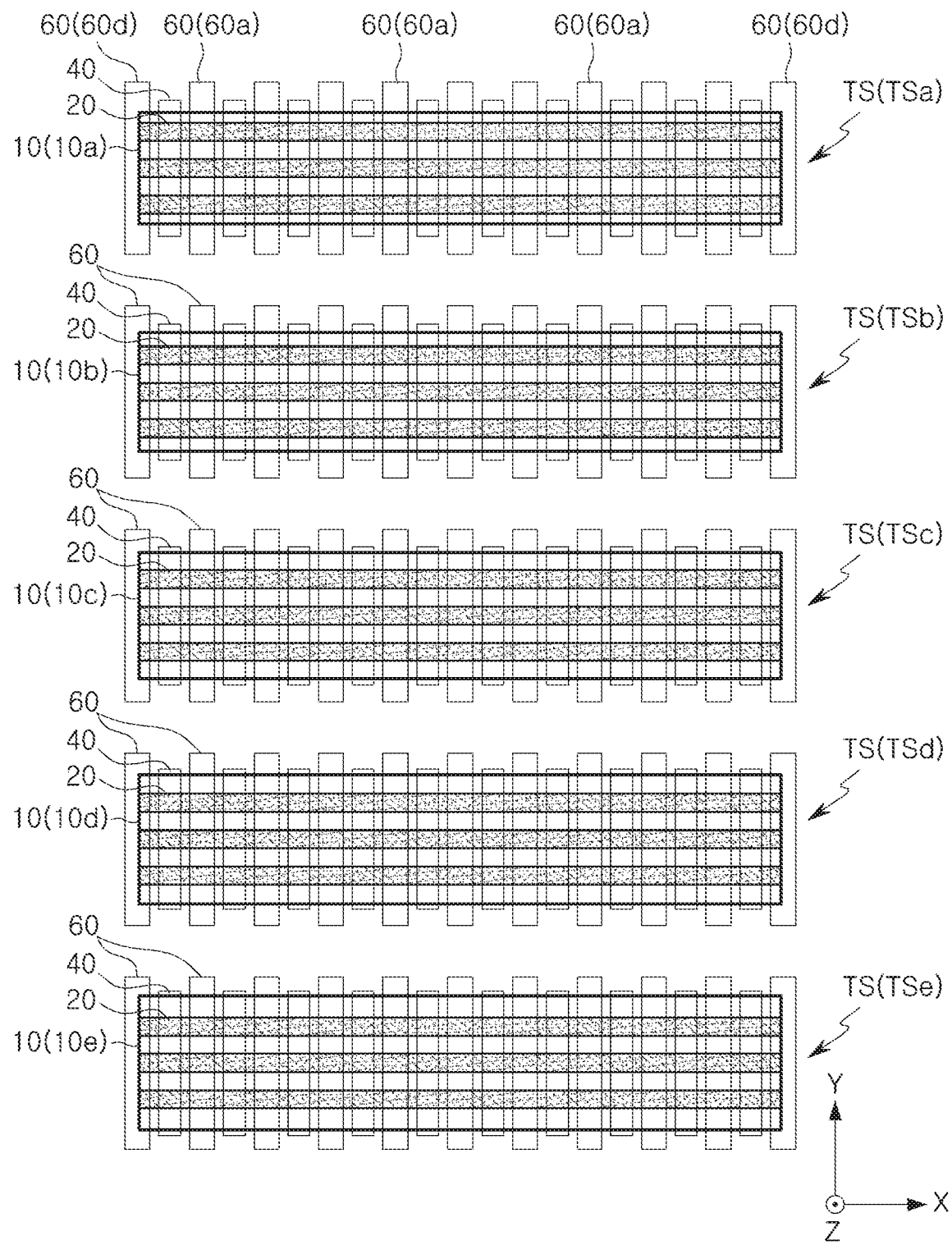
FIG. 8A is a plan view illustrating a modified example of test structures of a semiconductor device according to some example embodiments.

In the gate structures 60 illustrated in FIGS. 3A to 5, 6, and 7, a single active gate structure 60a, between the pair of dummy gate structures 60d extending on or covering ends of the upper active regions 20, is illustrated, but the inventive concepts described herein are not limited thereto. A modified example of the gate structures 60 described above will be described with reference to FIG. 8A. FIG. 8A is a plan view illustrating a modified example of test structures of a semiconductor device according to some example embodiments.

In a modified example, referring to FIG. 8A, each of the test structures TS according to some example embodiments may include a plurality of active gate structures 60a disposed between the pair of dummy gate structures 60d.

Figure 8B:
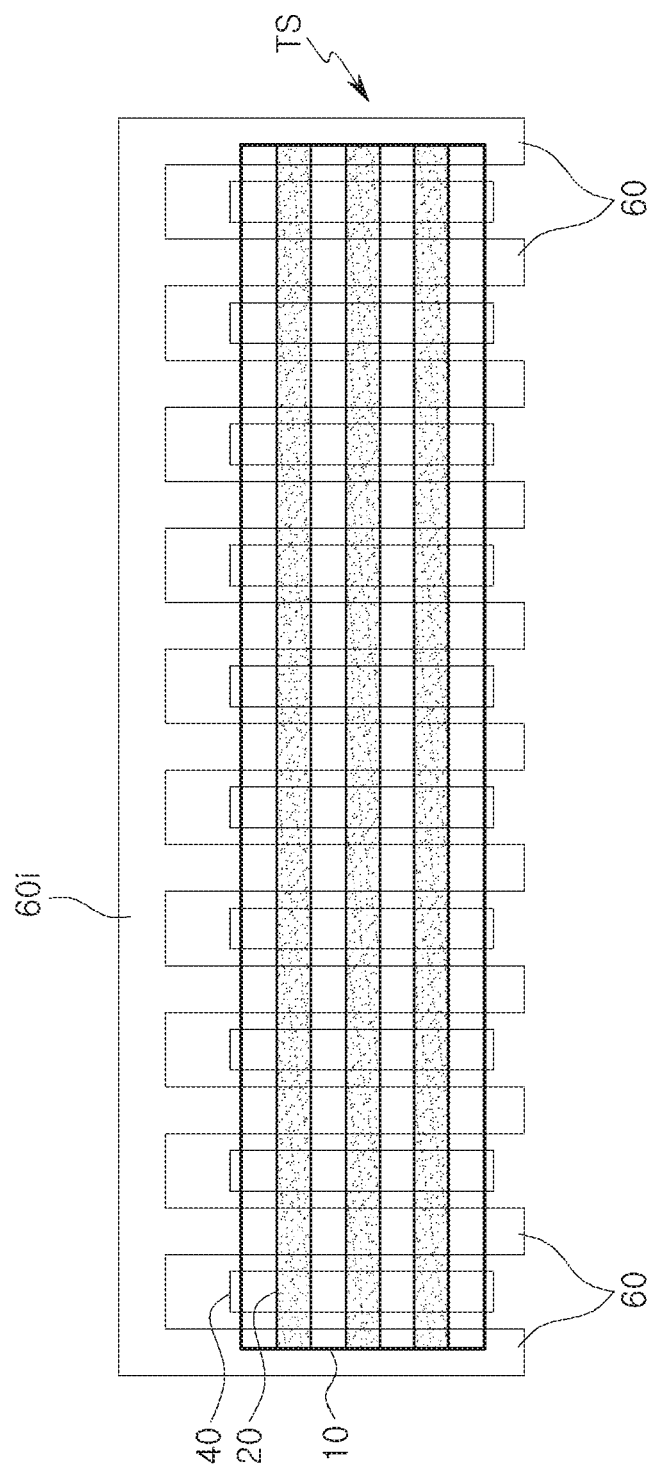
FIG. 8B is a plan view illustrating a modified example of test structures of a semiconductor device according to some example embodiments.

The gate structures 60, illustrated in FIGS. 3A to 5, 6, and 7, are illustrated as being spaced apart from each other, but the inventive concepts described herein are not limited thereto. With reference to FIG. 8B, a modified example of the gate structures 60 will be described. FIG. 8B is a plan view illustrating a modified example of a gate structure of test structures of a semiconductor device according to some example embodiments.

In a modified example, referring to FIG. 8B, a single test structure TS of a semiconductor device according to some example embodiments may include a plurality of gate structures 60 disposed on a single lower active region 10, and a gate connection portion 60i electrically connecting the plurality of gate structures 60 to each other. Thus, the gate structures 60, overlapping the single lower active region 10x, may be connected to each other by the gate connection portion 60i, and thus may be operated as a single gate. Thus, the gate structures 60 overlapping the single active region 10 illustrated in FIGS. 3A to 8 may be electrically connected to each other by the gate connection portion 60i as illustrated in FIG. 8B. The gate connection portion 60i described above may increase the detectability of electrical characteristics of the test structures TS.

Figure 9:
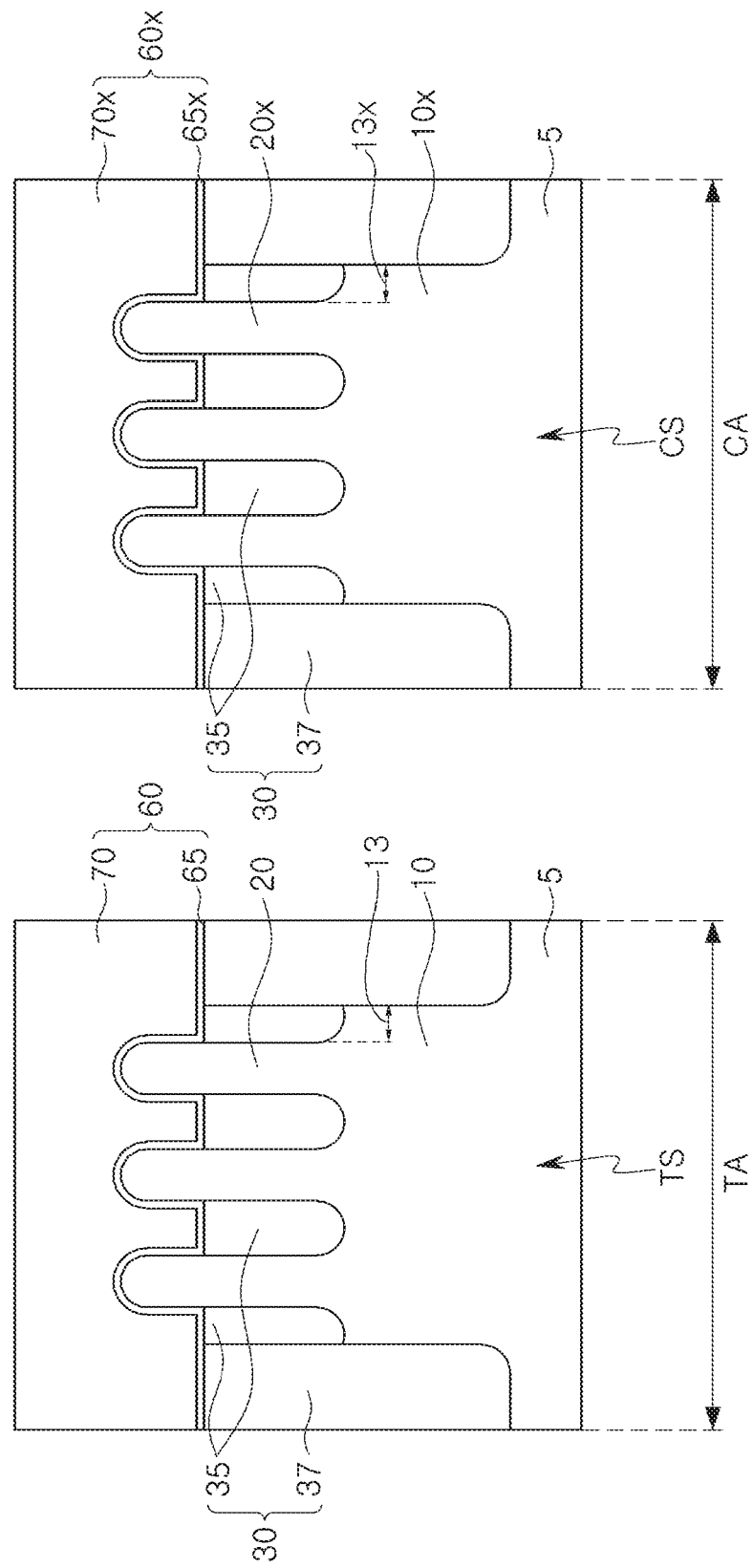
FIG. 9 is a cross-sectional view illustrating a semiconductor device according to some example embodiments.

The test structures TS described previously with reference to FIGS. 3A to 8B may be formed in the test regions (TA of FIG. 2) described with reference to FIGS. 1 and 2. One or more among the test structures TS described above may be formed in a structure the same as a circuit structure in the chip regions CA. Hereinafter, with reference to FIG. 9, one among the test structures TS described previously with reference to FIGS. 3A to 8B, and a circuit structure which may be formed in the chip regions CA described with reference to FIGS. 1 and 2 will be described. FIG. 9 is a cross-sectional view illustrating a circuit structure CS in the chip regions CA, together with the test structures TS described previously.

Referring to FIG. 9, the test structures TS described previously with reference to FIGS. 3A to 8B may be formed in the test regions (TA of FIG. 2) described with reference to FIGS. 1 and 2. The circuit structure CS may include a circuit lower active region 10x, a circuit upper active regions 20x disposed on the circuit lower active region 10x, and a gate structure 60x intersecting the circuit upper active regions 20x. The gate structure 60x may include a circuit gate electrode 70x and a circuit gate dielectric 65x extending on or covering a lower portion of the circuit gate electrode 70x.

The circuit upper active regions 20x may have a width equal to a width of the upper active regions 20 of the test structures TS described previously. A separation distance between the circuit upper active regions 20x may be equal to a separation distance of the upper active regions 20 of the test structures TS described previously.

The circuit lower active region 10x may have a structure similar to that of one among the lower active regions 10 of the test structures TS described previously. For example, the circuit lower active region 10x may have an outer region 13x having a width equal to a width of a single outer region 13 among the lower active regions 10. That is, the width of the outer region 13x of the circuit lower active region(s) 10x may be equal to a width of one outer region 13 among the different-width outer regions 13 of the lower active regions 10.

The lower active regions 10 having various widths of the test structures TS described previously may be used for improving or optimizing a planar area of the circuit lower active region 10x. For example, in a product, the circuit active region 10x may be formed using one among the lower active regions 10 of the test structures TS described previously, for example, the third lower active region 10c, and during or after the production of a plurality of semiconductor wafers, by testing the electrical characteristics or reliability of the test structures TS described previously, an appropriate one among the lower active regions 10, for example, the fourth lower active region 10d, is selected, and thus may be applied to a circuit active region of a next product. Thus, the test structures TS of the semiconductor device 1 according to embodiments of the inventive concepts may provide a guide for an improved or optimal planar area or an optimal width of a circuit lower active region.

Figure 10:
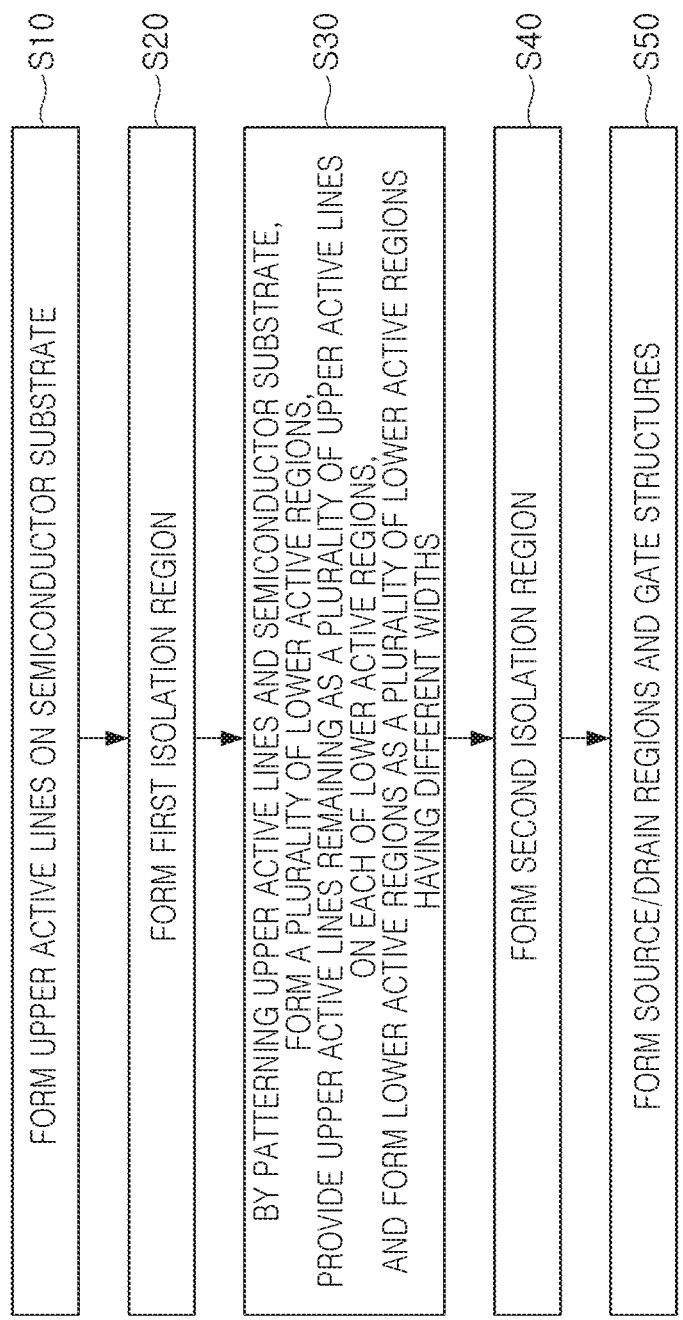
FIG. 10 is a process flow diagram illustrating an example of a method of forming a semiconductor device according to some example embodiments.

Next, an example of a method for forming the test structure TS described above will be described with reference to FIG. 10. FIG. 10 is a process flow diagram describing an example of a method for forming the test structure TS described above.

Referring to FIG. 10, upper active lines may be formed on a semiconductor substrate (S10). The semiconductor substrate may be a semiconductor wafer. Then, a first isolation region may be provided (S20). The first isolation region may define the upper active lines.

The upper active lines and the semiconductor substrate are patterned, so a plurality of lower active regions are provided. Moreover, the upper active lines may remain on each of the lower active regions as a plurality of upper active regions, and the lower active regions may be provided as a plurality of lower active regions having different widths (S30). Here, the plurality of lower active regions having different widths may be the lower active regions 10 of the test structures TS described previously with reference to FIGS. 3A to 9, and the upper active lines remaining on each of the lower active regions as a plurality of upper active regions may be the upper active regions 20 of the test structures TS described previously with reference to FIGS. 3A to 9.

While the upper active lines and the semiconductor substrate are patterned, the first isolation region is also patterned, and thus may remain on each of the lower active regions. Here, the first isolation region, remaining on each of the lower active regions, may be the first isolation region 35 described previously.

A second isolation region may be provided (S40). Here, the second isolation region may be the second isolation region 37 described previously. Forming the second isolation region may include forming an insulating material layer on a resulting product, obtained by patterning the upper active lines and the semiconductor substrate, and etching the insulating material layer and the first isolation region until upper regions of the upper active lines are exposed. Thus, an isolation region 30, including the first isolation region 35 and the second isolation region 37 described previously, may be provided.

Then, source/drain regions and gate structures may be provided (S50).

Next, a semiconductor device according to another example embodiment will be described with reference to FIGS. 11 to 22B.

Figure 11:
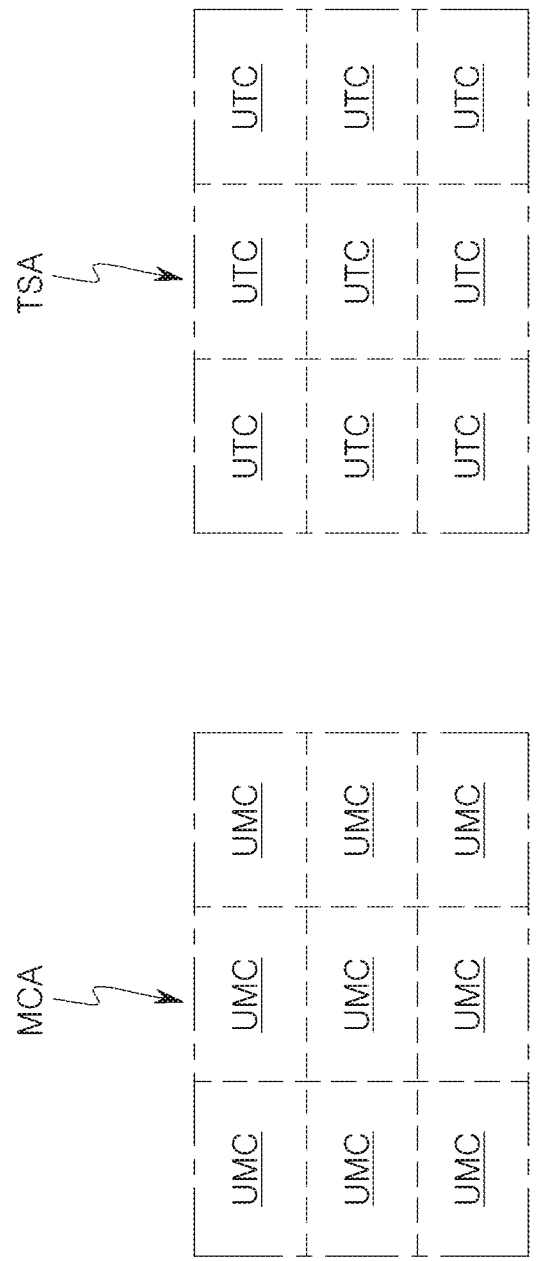
FIG. 11 is a schematic block diagram illustrating a modified example of a semiconductor device according to some example embodiments.

First, with reference to FIGS. 11 and 12, a modified example of a semiconductor device 1 according to some example embodiments will be described. FIG. 11 is a block diagram conceptually illustrating a modified example of a semiconductor device according to some example embodiments, and FIG. 12 is a circuit diagram illustrating a portion of a semiconductor device according to some example embodiments.

Figure 12:
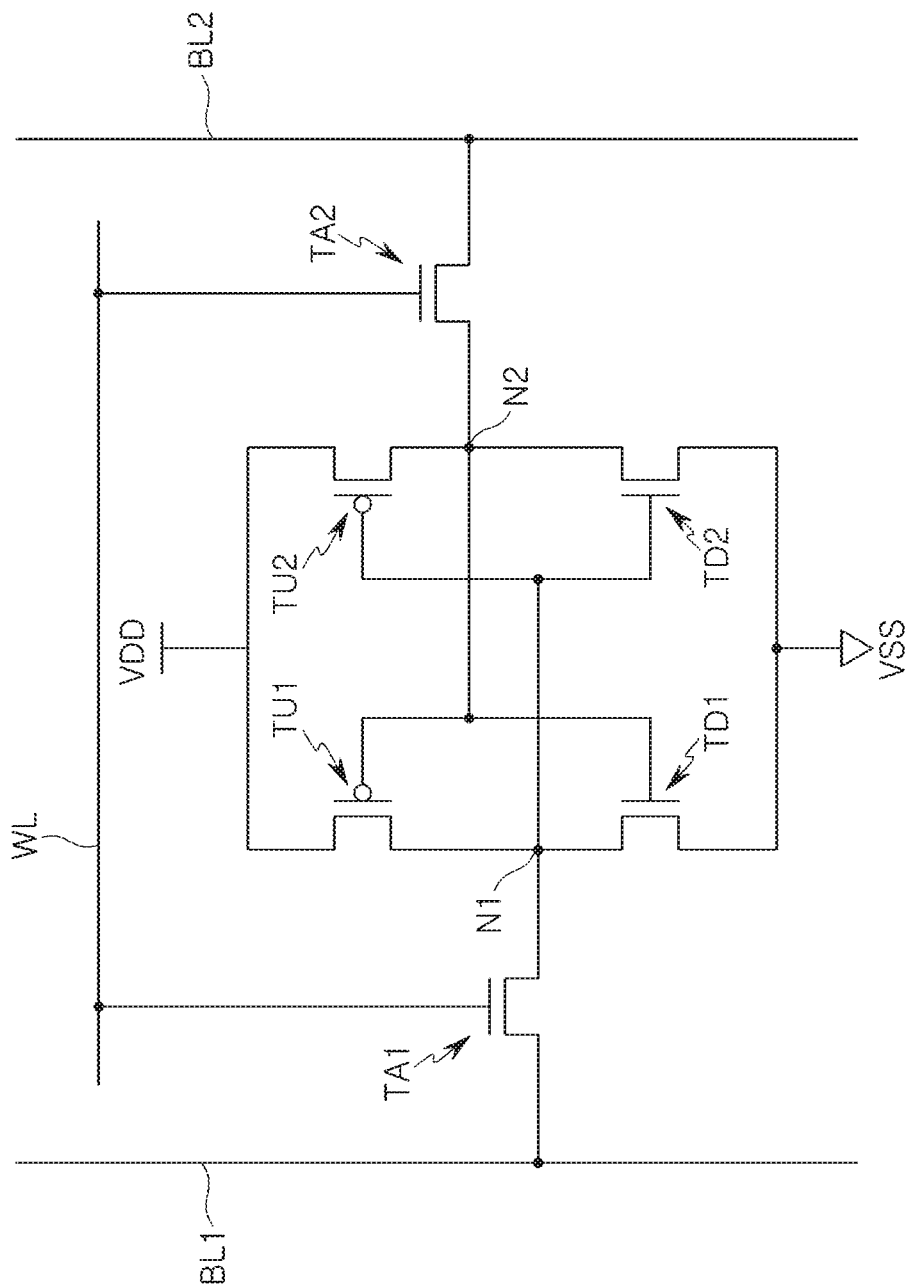
FIG. 12 is a circuit diagram illustrating a portion of a semiconductor device according to some example embodiments.

Referring to FIGS. 11 and 12, together with FIGS. 1 and 2, a semiconductor device according to some example embodiments may include a memory cell array region MCA formed by arranging a unit memory cell region UMC, provided as a plurality of unit memory cell regions, in the chip regions CA, and a test region TSA formed by arranging a unit test region UTC, provided as a plurality of unit test regions, in the test regions TA. The test region TSA may be the test region TA described with reference to FIGS. 1 and 2.

The memory cell array region MCA may be a region in which a memory cell array of a static random access memory (SRAM) is provided, while the unit memory cell region UMC may be a region in which a unit memory cell of the SRAM is provided.

The SRAM unit memory cell of the unit memory cell region UMC may include a pair of first and second pull-up transistors TU1 and TU2, a pair of first and second pull-down transistors TD1 and TD2, and a pair of first and second access transistors TA1 and TA2. The pair of first and second pull-down transistors TD1 and TD2 and the pair of first and second access transistors TA1 and TA2 may be n-type metal oxide semiconductor (NMOS) transistors, while the pair of first and second pull-up transistors TU1 and TU2 may be p-type metal oxide semiconductor (PMOS) transistors.

The first pull-down transistor TD1 and the first access transistor TA1 may be connected in series. A source of the first pull-down transistor TD1 may be electrically connected to a ground voltage line VSS, while a drain of the first access transistor TA1 may be electrically connected to a first bit line BL1. In a manner similar thereto, the second pull-down transistor TD2 and the second access transistor TA2 may be connected in series. A source of the second pull-down transistor TD2 may be electrically connected to a ground voltage line VSS, while a drain of the second access transistor TA2 may be electrically connected to a second bit line BL2.

The source and the drain of the first pull-up transistor TU1 may be electrically connected to a power supply voltage line VDD and a drain of the first pull-down transistor TD1, respectively. In a manner similar thereto, the source and the drain of the second pull-up transistor TU2 may be electrically connected to the power supply voltage line VDD and a drain of the second pull-down transistor TD2, respectively.

The drain of the first pull-up transistor TU1, the drain of the first pull-down transistor TD1, and the source of the first access transistor TA1 may correspond to a first node N1. Moreover, the drain of the second pull-up transistor TU2, the drain of the second pull-down transistor TD2, and the source of the second access transistor TA2 may correspond to a second node N2.

A gate electrode of the first pull-down transistor TD1 and a gate electrode of the first pull-up transistor TU1 may be electrically connected to the second node N2, while a gate electrode of the second pull-down transistor TD2 and a gate electrode of the second pull-up transistor TU2 may be electrically connected to the first node N1. Moreover, the gate electrodes of the first and second access transistors TA1 and TA2 may be electrically connected to a word line WL.

Figure 13:
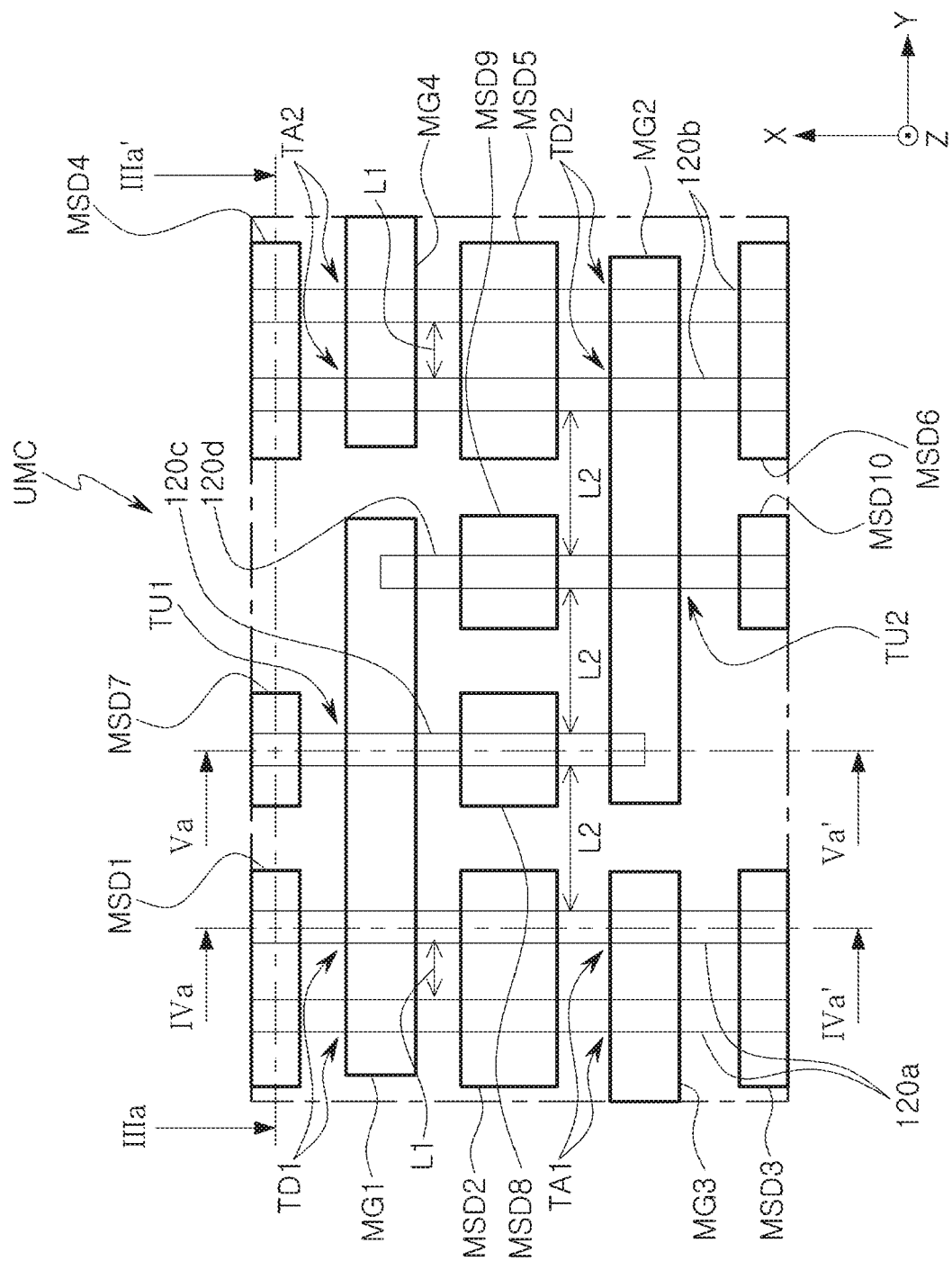
FIG. 13 is a plan view illustrating a portion of a semiconductor device according to some example embodiments.
Figure 14B:
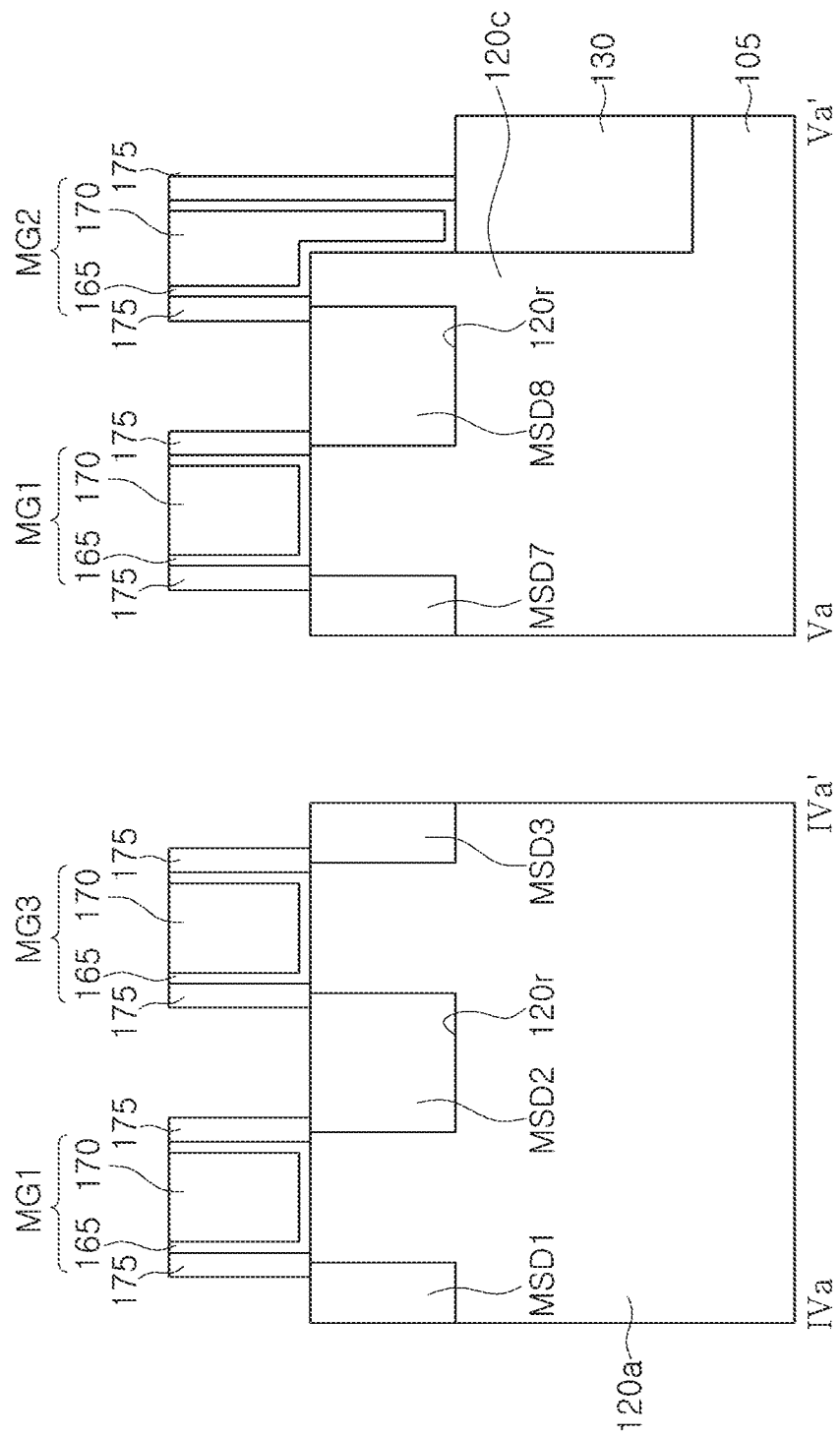

Next, with reference to FIGS. 13 to 14B, the unit memory cell region UMC described above will be described. FIGS. 13, 14A, and 14B are drawings illustrating gates and source/drains forming six transistors as described with reference to FIG. 12, such as the first and second pull-up transistors TU1 and TU2, the first and second pull-down transistors TD1 and TD2, as well as the first and second access transistors TA1 and TA2. In FIGS. 13 to 14B, FIG. 13 is a plan view illustrating the unit memory cell region UMC described previously, FIG. 14A is a cross-sectional view illustrating a region taken along line IIIa-IIIa' of FIG. 13, and FIG. 14B is a cross-sectional view illustrating a region taken along line IVa-IVa' and line Va-Va' of FIG. 13.

Referring to FIGS. 11 to 14B, on the semiconductor substrate 105, a pair of first memory active lines 120a, adjacent to each other, and a pair of second memory active lines 120b, adjacent to each other, may be provided. Between the pair of first memory active lines 120a and the pair of second memory active lines 120b, a single third memory active line 120c and a single fourth memory active line 120d may be provided.

When viewed in a cross section, the memory active lines 120a to 120d may be extended in the vertical direction Z, perpendicular to the semiconductor substrate 105, from the semiconductor substrate 105. The memory active lines 120a to 120d may pass through an isolation region 130 on the semiconductor substrate 105. The isolation region 130 may be formed of silicon oxide. The isolation region 130 may be a shallow trench isolation.

The third memory active line 120c may be closer to the pair of first memory active lines 120a as compared with the pair of second memory active lines 120b. The fourth memory active line 120d may be closer to the pair of second memory active lines 120b as compared with the pair of first memory active lines 120a.

When viewed in plan view, the pair of first memory active lines 120a, the pair of second memory active lines 120b, the third memory active line 120c, and the fourth memory active line 120d may have a linear or line shape extended in a first horizontal direction X.

When viewed in plan view, the pair of first memory active lines 120a and the pair of second memory active lines 120b may intersect the unit memory cell region UMC.

When viewed in plan view, the third memory active line 120c and the fourth memory active line 120d may have portions extended from sides of the unit memory cell region UMC, opposing each other, and overlapping in a second horizontal direction Y perpendicular to the first horizontal direction X, and ends thereof may be located in the unit memory cell region UMC. Thus, an end portion of the third memory active line 120c may be located between the fourth memory active line 120d and the pair of first memory active lines 120a, while an end portion of the fourth memory active line 120d may be located between the third memory active line 120c and the pair of second memory active lines 120b.

A separation distance L1 between the pair of first memory active lines 120a, and a separation distance L1 between the pair of second memory active lines 120b may be equal to each other.

A separation distance L2 between the third memory active line 120c and the fourth memory active line 120d, a separation distance L2 between the pair of first memory active lines 120a and the third memory active line 120c, and a separation distance L2 between the pair of second memory active lines 120b and the fourth memory active line 120d may be equal to each other, and may be greater than the separation distance L1 between the pair of first memory active lines 120a. For example, the separation distance L2 between the third memory active line 120c and the fourth memory active line 120d may be about twice the separation distance L1 between the pair of first memory active lines 120a.

When viewed in plan view, the first to fourth memory gate structures MG1, MG2, MG3, and MG4 having a linear or line shape extended in the second horizontal direction Y, perpendicular to the first horizontal direction X, or a bar shape elongated in the second horizontal direction Y may be provided. The first to fourth memory gate structures MG1, MG2, MG3, and MG4 may be spaced apart from each other. Each of the first to fourth memory gate structures MG1, MG2, MG3, and MG4 may include a gate electrode 170 and a gate dielectric 165 extending on or covering a lower surface and a side surface of the gate electrode 170. Insulative spacers 175 may be formed on side surfaces of the first to fourth memory gate structures MG1, MG2, MG3, and MG4.

The first memory gate structure MG1 may simultaneously intersect the pair of first memory active lines 120*a* and the third memory active line 120*c*. In one example, the first memory gate structure MG1 may extend on or cover an end portion of the fourth memory active line 120*d* while simultaneously intersecting the pair of first memory active lines 120*a* and the third memory active line 120*c*.

The second memory gate structure MG2 may simultaneously intersect the pair of second memory active lines 120*b* and the fourth memory active line 120*d*. In one example, the second memory gate structure MG2 may extend on or cover an end portion of the third memory active line 120*c* while simultaneously intersecting the pair of second memory active lines 120*b* and the fourth memory active line 120*d*.

The third memory gate structure MG3 may have an end portion opposing an end portion of the second memory gate structure MG2, while intersecting the pair of first memory active lines 120*a*.

The fourth memory gate structure MG4 may have an end portion opposing an end portion of the first memory gate structure MG1, while intersecting the pair of second memory active lines 120*b*.

In the unit memory cell region UMC, the first to tenth memory source/drain regions MSD1, MSD2, MSD3, MSD4, MSD5, MSD6, MSD7, MSD8, MSD9, and MSD10, spaced apart from each other, may be disposed therein.

The first to third memory source/drain regions MSD1, MSD2, and MSD3 may be provided on the pair of first memory active lines 120*a*, and may be sequentially arranged in the first horizontal direction X. The second memory source/drain region MSD2 may be disposed between the first memory source/drain region MSD1 and the third memory source/drain region MSD3.

Each of the first to third memory source/drain regions MSD1, MSD2, and MSD3 may be provided as an epitaxial layer grown from each of the pair of first memory active lines 120*a* to be connected and merged.

The first memory source/drain region MSD1 and the second memory source/drain region MSD2 may be formed on both sides of the first memory gate structure MG1, while the second memory source/drain region MSD2 and the third memory source/drain region MSD3 may be formed on both sides of the third memory gate structure MG3. Here, the second memory source/drain region MSD2 may be formed between the first memory gate structure MG1 and the third memory gate structure MG3.

The fourth to sixth memory source/drain regions MSD4, MSD5, and MSD6 may be provided on the pair of second memory active lines 120*b*, and may be sequentially arranged in the first horizontal direction X. The fifth memory source/drain region MSDS may be disposed between the fourth memory source/drain region MSD4 and the sixth memory source/drain region MSD6.

Each of the fourth to sixth memory source/drain regions MSD4, MSD5, and MSD6 may be provided as an epitaxial layer grown from each of the pair of second memory active lines 120*b* to be connected and merged. Thus, each of the first, second, and third memory source/drain regions MSD1, MSD2, and MSD3, as well as the fourth, fifth, and sixth memory source/drain regions MSD4, MSD5, and MSD6 may be provided as a merged epitaxial layer.

The fourth memory source/drain region MSD4 and the fifth memory source/drain region MSD5 may be formed on both sides of the fourth memory gate structure MG4, while the fifth memory source/drain region MSDS and the sixth memory source/drain region MSD6 may be formed on both sides of the second memory gate structure MG2. Here, the fifth memory source/drain region MSDS may be formed between the fourth memory gate structure MG4 and the second memory gate structure MG2.

The seventh memory source/drain region MSD7 and the eighth memory source/drain region MSD8 may be formed on the third memory active line 120*c*, and may be formed on both sides of the first memory gate structure MG1. The ninth memory source/drain region MSD9 and the tenth memory source/drain region MSD10 may be formed on the fourth memory active line 120*d*, and may be formed on both sides of the second memory gate structure MG2.

Each of the seventh to tenth memory source/drain regions MSD7, MSD8, MSD9, and MSD10 may be provided as an epitaxial layer grown from a single active line.

When viewed in a cross section in which an active line is cut in the first horizontal direction X, the first to tenth memory source/drain regions MSD1, MSD2, MSD3, MSD4, MSDS, MSD6, MSD7, MSD8, MSD9, and MSD10 may be provided as an epitaxial layer filling recess regions 120*r* of the memory active lines 120*a* to 120*d*.

On the pair of first memory active lines 120*a*, the first memory gate structure MG1, the first memory source/drain region MSD1, and the second memory source/drain region MSD2 may form the first pull-down transistor TD1, described with reference to FIG. 12, while the third memory gate structure MG3, the second memory source/drain region MSD2, and the third memory source/drain region MSD3 may form the first access transistor TA1, described with reference to FIG. 12.

On the pair of second memory active lines 120*b*, the second memory gate structure MG2, the fifth memory source/drain region MSDS, and the sixth memory source/drain region MSD6 may form the second pull-down transistor TD2, described with reference to FIG. 12, while the fourth memory gate structure MG4, the fourth memory source/drain region MSD4, and the fifth memory source/drain region MSDS may form the second access transistor TA2, described with reference to FIG. 12.

On the third memory active line 120*c*, the first memory gate structure MG1, the seventh memory source/drain region MSD7, and the eighth memory source/drain region MSD8 may form the first pull-up transistor TU1, described with reference to FIG. 12.

On the fourth memory active line 120*d*, the second memory gate structure MG2, the ninth memory source/drain region MSD9, and the tenth memory source/drain region MSD10 may form the second pull-up transistor TU2, described with reference to FIG. 12.

Thus, in the unit memory cell region UMC, six transistors TD1, TD2, TU1, TU2, TA1, and TA2, as described with reference to FIG. 12, may be disposed therein.

In the unit memory cell region UMC, the first memory source/drain region MSD1 and the seventh memory source/drain region MSD7, opposing each other, and the sixth memory source/drain source/drain region MSD6 and the tenth memory source/drain region MSD10, opposing each other, should be reliably electrically isolated from each other in a semiconductor device including an SRAM.

Figure 15:
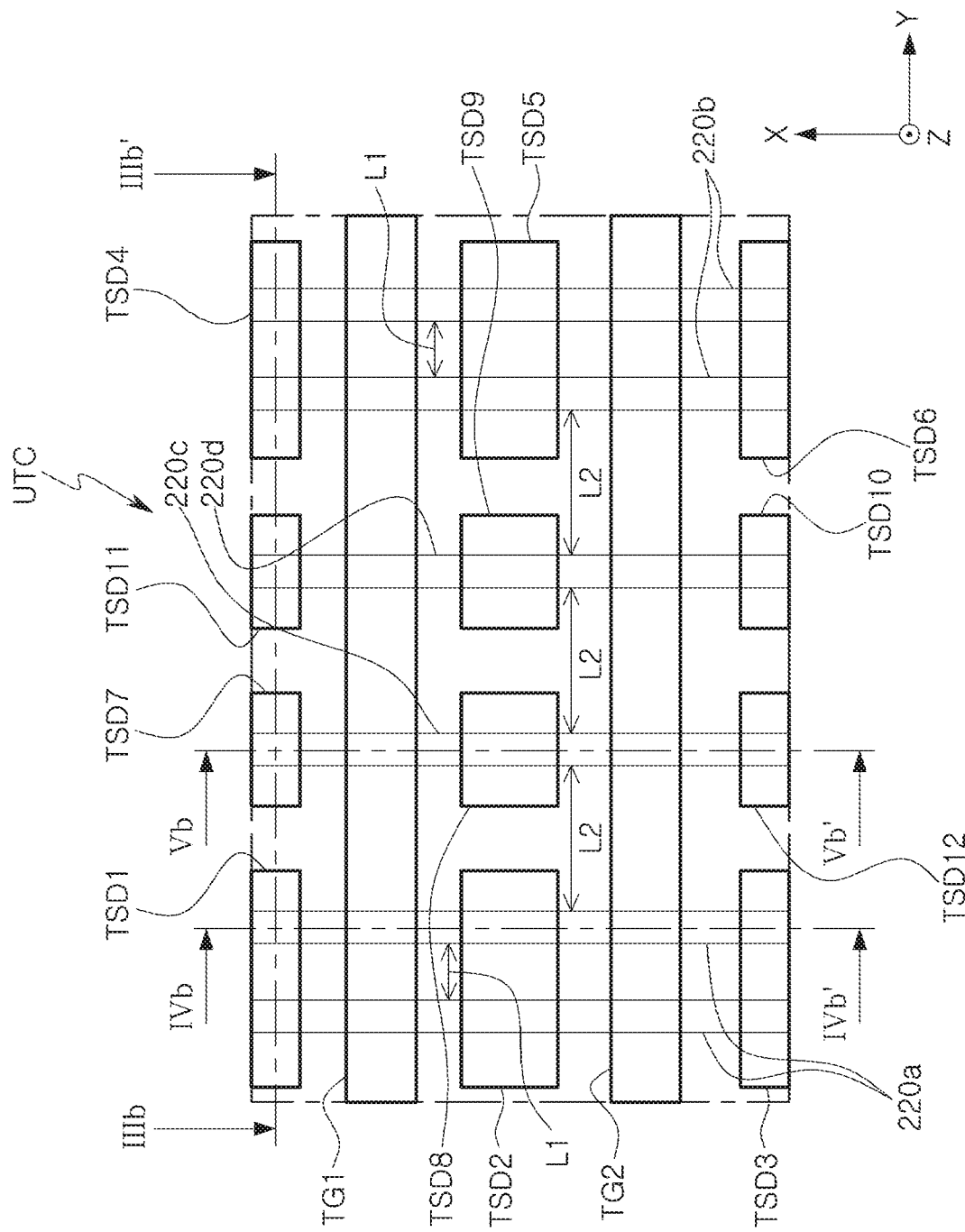
FIG. 15 is a plan view illustrating a portion of a semiconductor device according to some example embodiments.

Hereinafter, a test structure for evaluating leakage current characteristics or reliability between the first memory source/drain region MSD1 and the seventh memory source/drain region MSD7, opposing each other, and between the sixth memory source/drain source/drain region MS6 and the tenth memory source/drain region MSD10, opposing each other, will be described. The test structure described above may be included in a unit test region UTC. Together with the unit memory cell region UMC described previously with reference to FIGS. 11 to 14B, with reference to FIGS. 15 to 16B, the unit test region UTC of FIG. 11 will be described. FIG. 15 is a plan view illustrating the unit test region UTC described previously, FIG. 16A is a cross-sectional view illustrating a region taken along line IIIb-IIIb' of FIG. 15, and FIG. 16B is a cross-sectional view illustrating a region taken along line IVa-IVa' and line Va-Va' of FIG. 13.

Figure 16A:
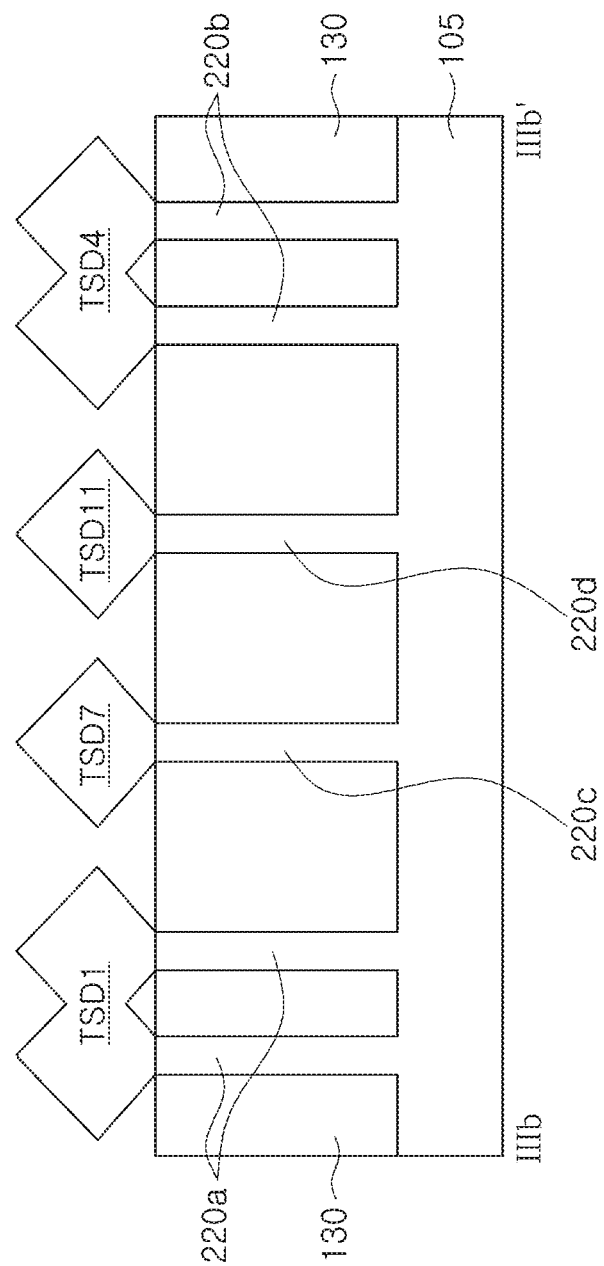
FIGS. 16A and 16B are cross-sectional views illustrating a portion of a semiconductor device according to some example embodiments.
Figure 16B:
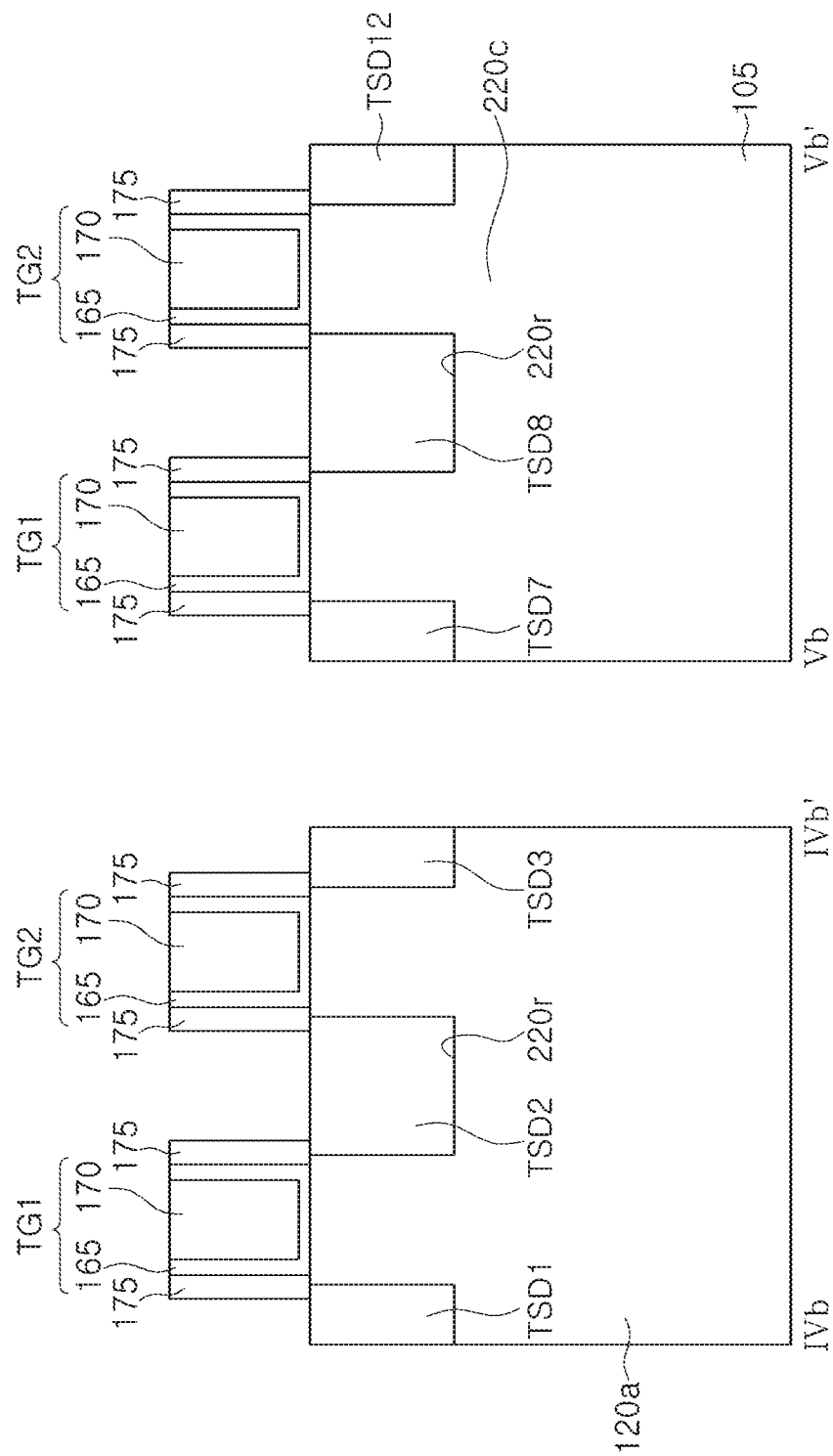

Referring to FIGS. 15 to 16B, together with FIGS. 11 to 14B, a unit test region UTC having a planar size or plan view area or footprint equal to that of the unit memory cell region UMC, for example, having the same planar area and horizontal (e.g., along the Y-direction) and vertical (e.g., along the X-direction) ratio, may be provided.

In the unit test region UTC, a pair of first test active lines 220a and a pair of second test active lines 220b, corresponding to the pair of first memory active lines 120a and the pair of second memory active lines 120b, respectively, in the unit memory cell region UMC, may be disposed therein. Thus, the pair of first test active lines 220a may have a size equal to that of the pair of first memory active lines 120a, while the pair of second test active lines 220b may have a size equal to that of the pair of second memory active lines 120b.

In the unit test region UTC, between the pair of first test active lines 220a and the pair of second test active lines 220b, a single third test active line 220c and a single fourth test active line 220d may be disposed.

The third test active line 220c may be closer to the pair of first test active lines 220a as compared with the pair of second test active lines 220b, while the fourth test active line 220d may be closer to the pair of second test active lines 220b as compared with the pair of first test active lines 220a. Thus, the third test active line 220c may be disposed between the pair of first test active lines 220a and the fourth test active line 220d, while the fourth test active line 220d may be disposed between the third test active line 220c and the pair of second test active lines 220b.

In the unit test region UTC, the third test active line 220c may have a shape the same as a shape in which the third memory active line 120c in the unit memory cell region UMC is extended to intersect the unit memory cell region UMC, while the fourth test active line 220d may have a shape the same as a shape in which the fourth memory active line 120d in the unit memory cell region UMC is extended to intersect the unit memory cell region UMC. Thus, when viewed in the second horizontal direction Y, separation distances L1 and L2 between the test active lines 220a, 220b, 220c, and 220d, adjacent to each other, in the unit test region UTC, may be equal to separation distances L1 and L2 between the memory active lines 120a, 120b, 120c, and 120d in the unit memory cell region UMC. As such, further detailed description of the separation distances L1 and L2 will be omitted.

Moreover, the test active lines 220a, 220b, 220c, and 220d, in the unit test region UTC, may pass through an isolation region 130, formed on the semiconductor substrate 105, in a manner similar to the memory active lines 120a, 120b, 120c, and 120d in the unit memory cell region UMC.

In the unit test region UTC, the first test gate structure TG1 and the second test gate structure TG2, extended in the second horizontal direction Y, may be disposed therein.

In the unit test region UTC, the first test gate structure TG1 may have a shape in which the first memory gate structure MG1 and the fourth memory gate structure MG4, in the unit memory cell region UMC, are extended in the second horizontal direction Y to be connected to each other, while the second test gate structure TG2 may have a shape in which the second memory gate structure MG2 and the third memory gate structure MG3, in the unit memory cell region UMC, are extended in the second horizontal direction Y to be connected to each other.

Each of the first test gate structure TG1 and the second test gate structure TG2 may have a structure the same as or similar to that of each of the first memory gate structure MG1 and the fourth memory gate structure MG4. For example, each of the first test gate structure TG1 and the second test gate structure TG2 may be provided as or otherwise defined by the gate dielectric 165 and the gate electrode 170, forming each of the first memory gate structure MG1 to fourth memory gate structure MG4. Insulative spacers 175 may be formed on side surfaces of the first test gate structure TG1 and the second test gate structure TG2.

In the unit test region UTC, the first to tenth test source/drain regions TSD1, TSD2, TSD3, TSD4, TSDS, TSD6, TSD7, TSD8, TSD9, and TSD10, corresponding to the first to tenth memory source/drain regions MSD1, MSD2, MSD3, MSD4, MSDS, MSD6, MSD7, MSD8, MSD9, and MSD10 in the unit memory cell region UMC, respectively, may be disposed therein. Since the first to tenth test source/drain regions TSD1, TSD2, TSD3, TSD4, TSD5, TSD6, TSD7, TSD8, TSD9, and TSD10 in the unit test region UTC may be disposed by position and may be arranged by size, the same as those of the first to tenth memory source/drain regions MSD1, MSD2, MSD3, MSD4, MSD5, MSD6, MSD7, MSD8, MSD9, MSD10 in the unit memory cell region UMC, the arrangement position and size of the first to tenth test source/drain regions TSD1, TSD2, TSD3, TSD4, TSD5, TSD6, TSD7, TSD8, TSD9, and TSD10 may be understood from the arrangement position and size of the first to tenth memory source/drain regions MSD1, MSD2, MSD3, MSD4, MSD5, MSD6, MSD7, MSD8, MSD9, and MSD10. For example, each of the first to third test source/drain regions TSD1, TSD2, and TSD3, the fourth to sixth test source/drain regions TSD4, TSDS, and TSD6, the first to third memory source/drain regions MSD1, MSD2, and MSD3, as well as the fourth to sixth memory source/drain regions MSD4, MSD5, and MSD6 may be provided as an epitaxial layer, grown from a pair of active lines adjacent to each other, to be connected and merged.

The unit test region UTC may further include an eleventh test source/drain region TSD11 and a twelfth test source/drain region TSD12, as compared with the unit memory cell region UMC.

The eleventh test source/drain region TSD11 may be disposed on the fourth test active line 220d, and may be disposed between the seventh test source/drain region TSD7 and the fourth test source/drain region TSD4. The twelfth test source/drain region TSD12 may be disposed on the third test active line 220c, and may be disposed between the third test source/drain region TSD3 and the tenth test source/drain region TSD10.

Each of the seventh to twelfth test source/drain regions TSD7, TSD8, TSD9, TSD10, TSD11, and TSD12, as well as the seventh to tenth memory source/drain regions MSD7, MSD8, MSD9, and MSD10 may be provided as an epitaxial layer grown from a single active line.

When viewed in a cross section in which a test active line is cut in the first horizontal direction X, each of the first to twelfth test source/drain regions TSD1 to TSD12 may be provided as an epitaxial layer filling a recess region 220r of a test active line.

In some example embodiments, the pair of first memory active lines 120a, the pair of second memory active lines 120b, the pair of first test active lines 220a, as well as the pair of second test active lines 220c may have a P-type conductivity, while the third memory active line 120c and the fourth memory active line 120d, as well as the third test active line 220c and the fourth test active line 220d may have an N-type conductivity.

In some example embodiments, the first to sixth memory source/drain regions MSD1, MSD2, MSD3, MSD4, MSD5, and MSD6, as well as the first to sixth test source/drain regions TSD1, TSD2, TSD3, TSD4, TSD5, and TSD6 may be source/drain regions having an N-type conductivity, while the seventh to tenth memory source/drain regions MSD7, MSD8, MSD9, and MSD10, and the seventh to twelfth test source/drain regions TSD7, TSD8, TSD9, TSD10, TSD11, and TSD12 may be source/drain regions having a P-type conductivity.

In some example embodiments, as illustrated in FIG. 13, in the unit memory cell region UMC, a portion in which source/drain regions having different types of conductivity oppose each other is provided as the total of four portions, for example, the first memory source/drain region MSD1 and the seventh memory source/drain region MSD7, opposing each other, the sixth memory source/drain region MSD6 and the tenth memory source/drain region MSD10, opposing each other, the second memory source/drain region MSD2 and the eighth memory source/drain region MSD8, opposing each other, as well as the fifth memory source/drain region MSD5 and the ninth memory source/drain region MSD9, opposing each other.

As illustrated in FIG. 15, in the unit test region UTC, a portion in which source/drain regions having different types of conductivity oppose each other is provided as the total of six portions, for example, the first test source/drain region TSD1 and the seventh test source/drain region TSD7, opposing each other, the sixth test source/drain region TSD6 and the tenth test source/drain region TSD10, opposing each other, the second test source/drain region TSD2 and the eighth test source/drain region TSD8, opposing each other, the fifth test source/drain region TSD5 and the ninth test source/drain region TSD9, opposing each other, the fourth test source/drain region TSD4 and the eleventh test source/drain region TSD11, opposing each other, as well as the third test source/drain region TSD3 and the twelfth test source/drain region TSD12, opposing each other.

Figure 17:
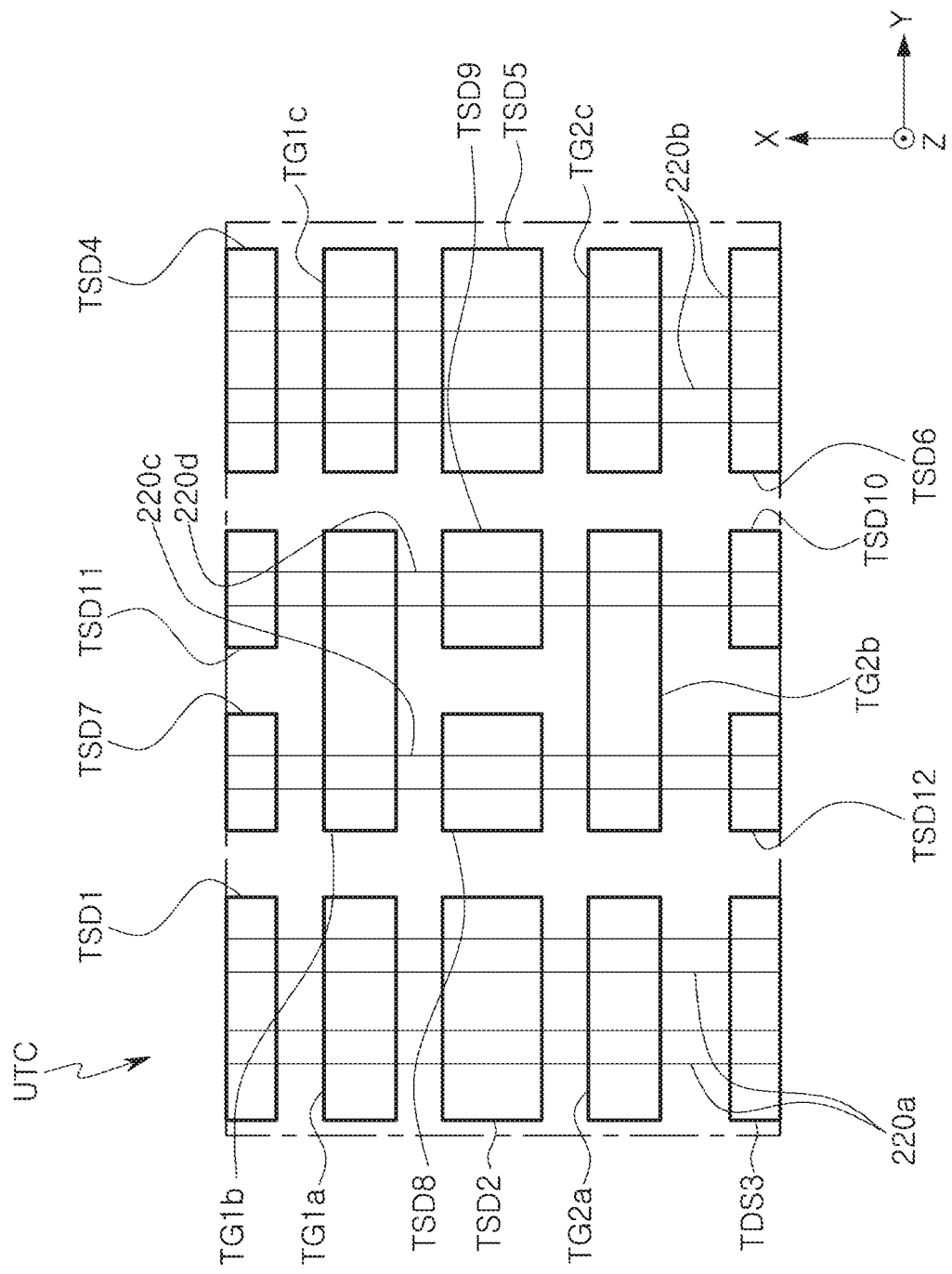
FIG. 17 is a plan view illustrating a modified example of a portion of a semiconductor device according to some example embodiments.

In FIG. 15, each of the first test gate structure TG1 and the second test gate structure TG2 may intersect the test active lines 220a, 220b, 220c, and 220d. However, the inventive concepts described herein are not limited thereto. For example, the first test gate structure (TG1 of FIG. 15) may be separated into a portion (TG1a of FIG. 17) overlapping the pair of first test active lines 220a, a portion (TG1b of FIG. 17) overlapping the third test active line 220c and the fourth test active line 220d, as well as a portion (TG1c of FIG. 17) overlapping the pair of second test active lines 220b. In a manner similar thereto, the second test gate structure (TG2 of FIG. 15) may be separated into a portion (TG2a of FIG. 17) overlapping the pair of first test active lines 220a, a portion (TG2b of FIG. 17) overlapping the third test active line 220c and the fourth test active line 220d, as well as a portion (TG2c of FIG. 17) overlapping the pair of second test active lines 220b. Here, FIG. 17 is a plan view illustrating a modified example of the first test gate structure TG1 and the second test gate structure TG2.

Figure 18:
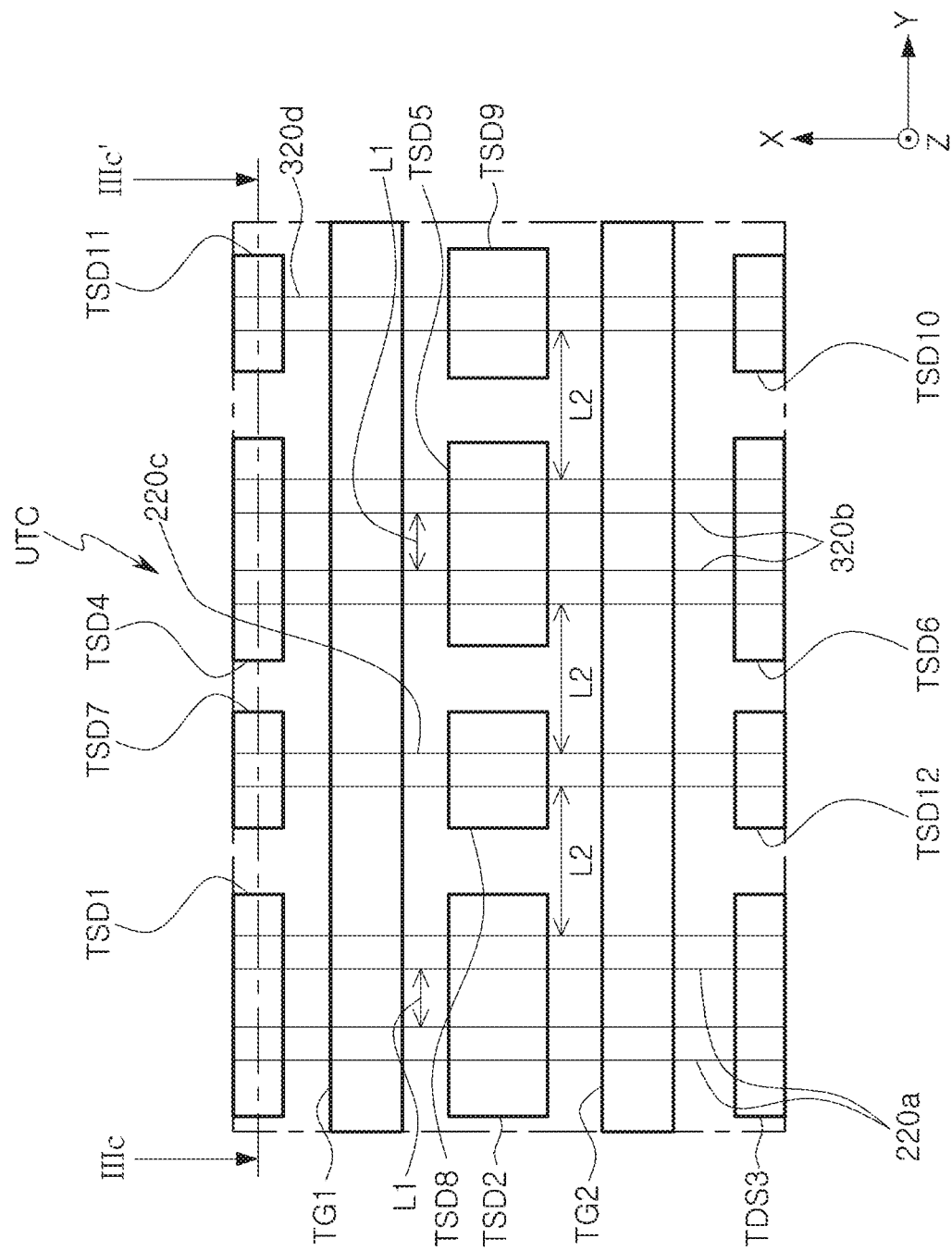
FIG. 18 is a plan view illustrating a modified example of a portion of a semiconductor device according to some example embodiments.
Figure 19:
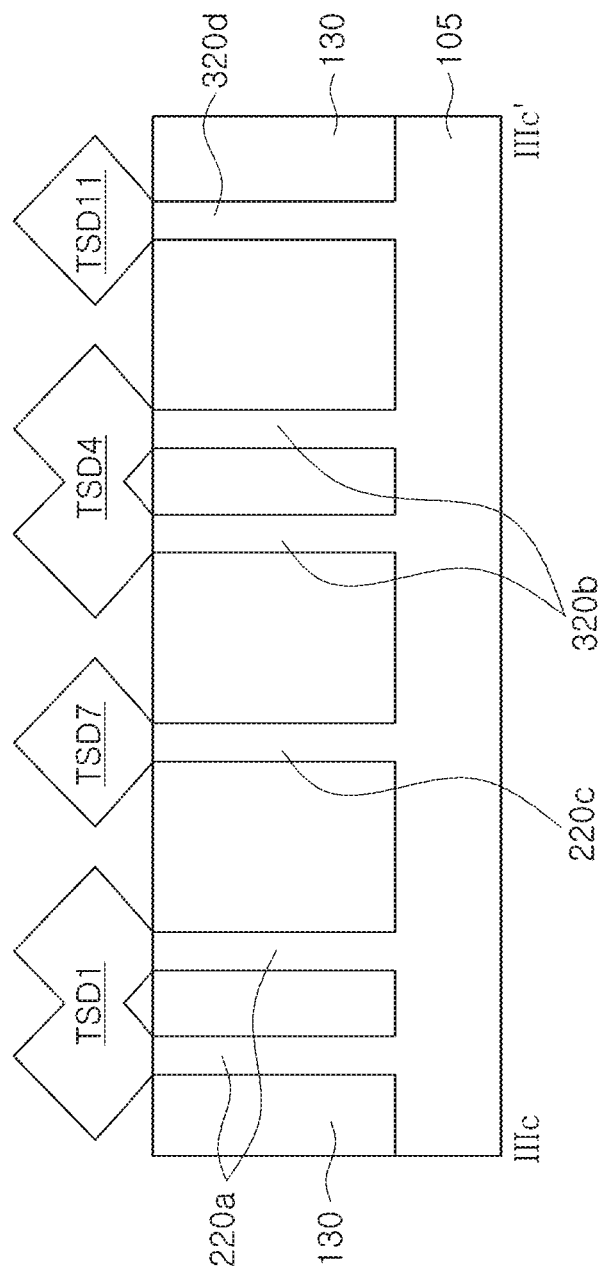
FIG. 19 is a cross-sectional view illustrating a modified example of a portion of a semiconductor device according to some example embodiments.
Figure 20:
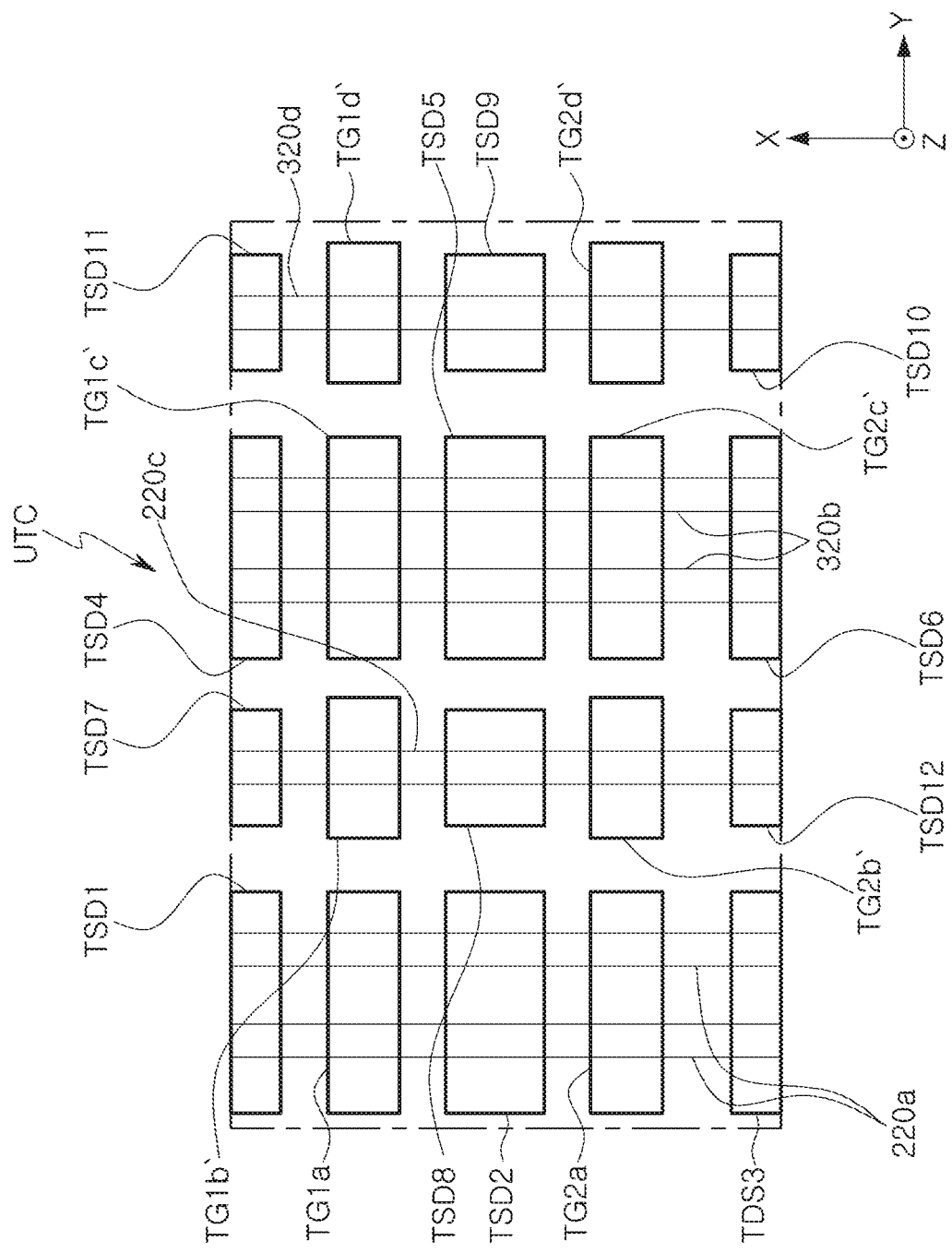
FIG. 20 is a plan view illustrating a modified example of a portion of a semiconductor device according to some example embodiments.

Next, a modified example of a unit test region UTC will be described with reference to FIGS. 18 and 19. FIG. 18 is a plan view illustrating a modified example of a unit test region UTC, while FIG. 19 is a cross-sectional view illustrating a region taken along line IIIc-IIIc' of FIG. 18. Here, FIGS. 18 and 19 only illustrate a portion modified from FIGS. 15, 16A, and 16B. Thus, some components described with reference to FIGS. 15, 16A, and 16B may be referred to, and a modified example of the position or arrangement of such components will be only described.

Referring to FIGS. 18 and 19, in a unit test region UTC, the pair of first test active lines 220a, the third test active line 220c, the first to third test source/drain regions TSD1, TSD2, and TSD3, the seventh, eighth, and twelfth test source/drain regions TSD7, TSD8, and TSD12, the same as or similar to those described with reference FIGS. 15, 16A, and 16B, may be arranged. In the unit test region UTC, a pair of second test active lines 320b and a fourth test active line 320d may be disposed. The pair of second test active lines 320b may be disposed between the third test active line 220c and the fourth test active line 320d. Thus, since the pair of second test active lines 320b and the fourth test active line 320d in the unit test region UTC of FIGS. 18 and 19 may be understood as having a shape in which positions of the pair of second test active lines 220b and the fourth test active line 220d (of FIGS. 15, 16A, and 16B) are switched, further detailed description of the arrangement relationship and the separation distances thereof will be omitted.

The fourth to sixth test source/drain regions (TSD4, TSD5, and TSD6 of FIG. 18), corresponding to the fourth to sixth test source/drain region (TSD4, TSD5, and TSD6 of FIG. 15) formed on the pair of second test active lines (220b of FIG. 15), illustrated in FIGS. 15, 16A, and 16B, may be disposed on the pair of second test active lines (320b of FIG. 18). In a manner similar thereto, the ninth, tenth, and eleventh test source/drain regions (TSD9, TSD10, and TSD11 of FIG. 18) corresponding to the ninth, tenth, and eleventh test source/drain regions (TSD9, TSD10, and TSD11 of FIG. 15) formed on the fourth test active line (220d of FIG. 15) described with reference to FIGS. 15, 16A, and 16B, may be disposed on the fourth test active line (320d of FIG. 18).

As described previously, in the unit memory cell region UMC of FIG. 13, a portion in which source/drain regions having different types of conductivity oppose each other may include a total of four portions. As illustrated in FIG. 18, in the unit test region UTC, a portion in which source/drain regions having different types of conductivity oppose each other may include a total of nine portions. For example, the seventh test source/drain region TSD7 may oppose two test source/drains, such as the first test source/drain TSD1 and the fourth test source/drain TSD4, the eighth test source/drain region TSD8 may oppose two test source/drains, such as the second test source/drain TSD2 and the fifth test source/drain TSDS, the twelfth test source/drain region TSD12 may oppose two test source/drains, such as the third test source/drain TSD3 and the sixth test source/drain TSD6, the eleventh test source/drain region TSD11 may oppose a single test source/drain, such as the fourth test source/drain TSD4, the ninth test source/drain region TSD9 may oppose a single test source/drain, such as the fifth test source/drain TSD5, and the tenth test source/drain region TSD10 may oppose a single test source/drain, such as the sixth test source/drain TSD6. As described above, as compared to memory source/drain regions disposed in the unit memory cell region UMC, opposing each other, and having different types of conductivity, the number of test source/drain regions disposed in the unit test region UTC, opposing each other, and having different types of conductivity may be greater. Thus, test structures, configured to or for more precisely checking leakage current characteristics and reliability between source/drain regions, opposing each other and having different types of conductivity, may be provided.

In FIG. 18, each of the first test gate structure TG1 and the second test gate structure TG2 may intersect the test active lines 220a, 320b, 220c, and 320d. However, the inventive concepts described herein are not limited thereto. For example, the first test gate structure (TG1 of FIG. 18) may be separated into a portion (TG1a of FIG. 20) overlapping the pair of first test active lines 220a, a portion (TG1b' of FIG. 20) overlapping the third test active line 220c, a portion (TG1c' of FIG. 20) overlapping the pair of second test active lines 320b, and a portion (TG1d' of FIG. 20) overlapping the fourth test active line 320d. In a manner similar thereto, the second test gate structure (TG2 of FIG. 18) may be separated into a portion (TG2a of FIG. 20) overlapping the pair of first test active lines 220a, a portion (TG2b' of FIG. 20) overlapping the third test active line 220c, a portion (TG2c' of FIG. 20) overlapping the pair of second test active lines 320b, and a portion (TG2d' of FIG. 20) overlapping the fourth test active line 320d.

Figure 21:
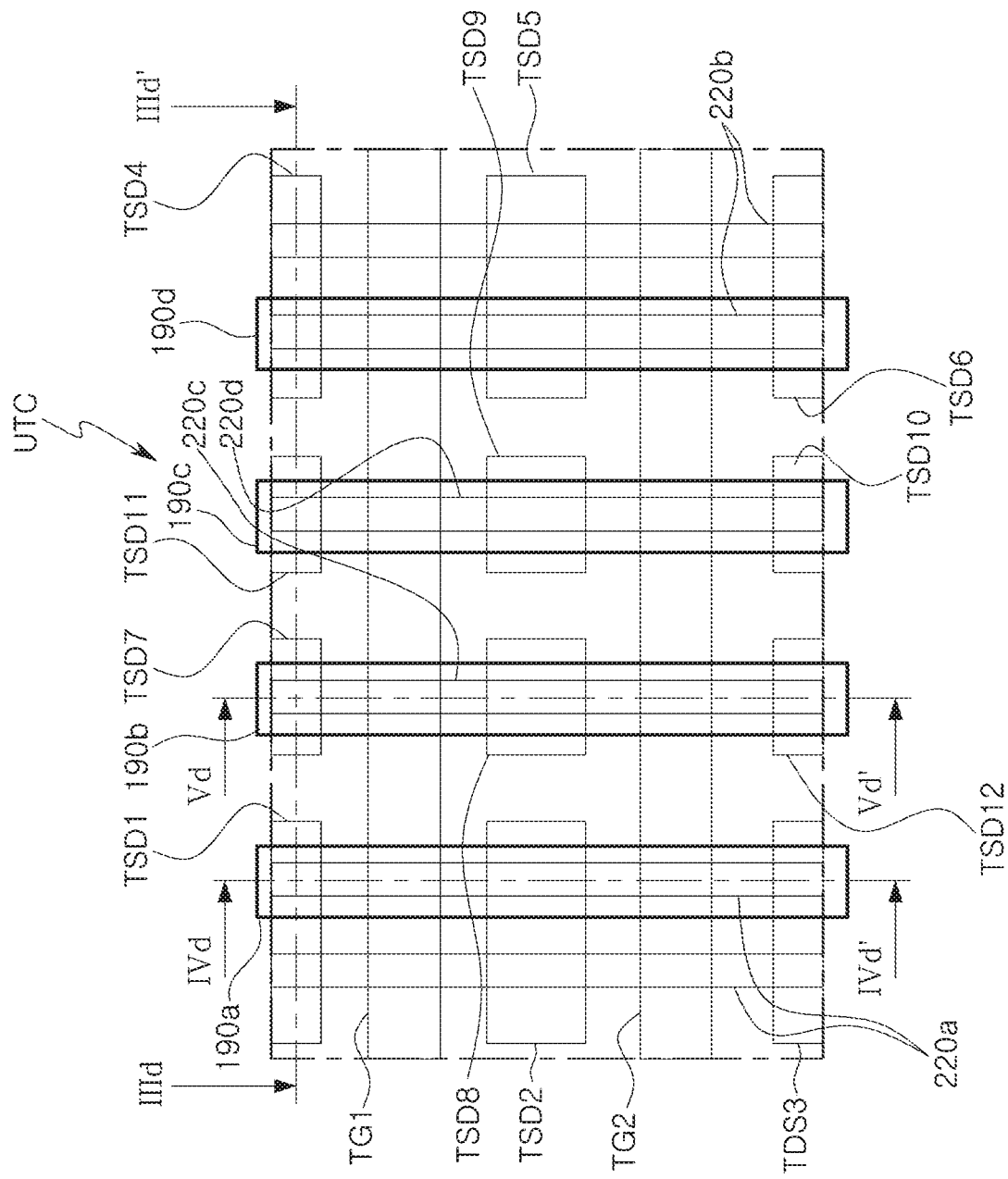
FIG. 21 is a plan view illustrating a modified example of a portion of a semiconductor device according to some example embodiments.
Figure 22A:
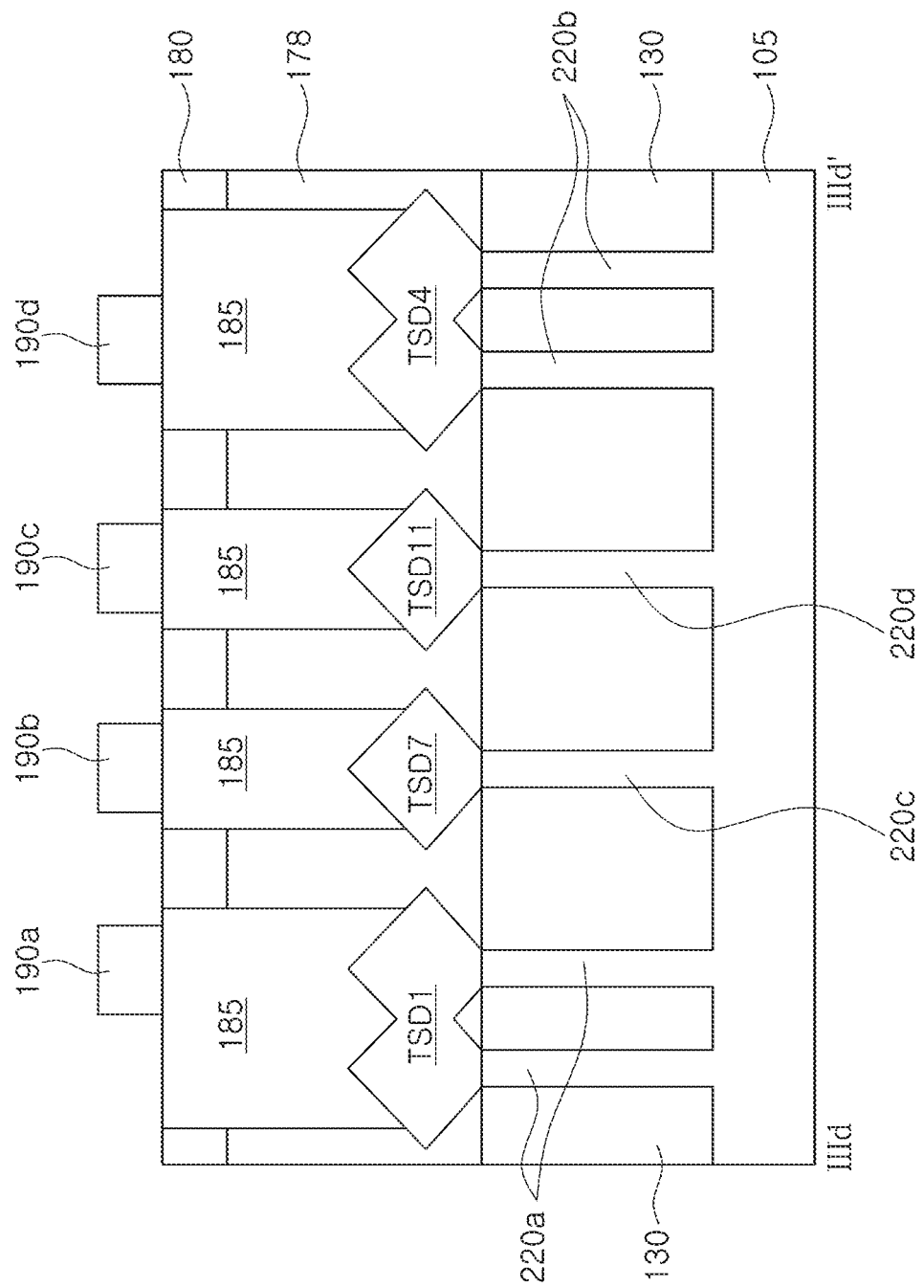
FIGS. 22A and 22B are cross-sectional views illustrating a portion of a semiconductor device according to some example embodiments.
Figure 22B:
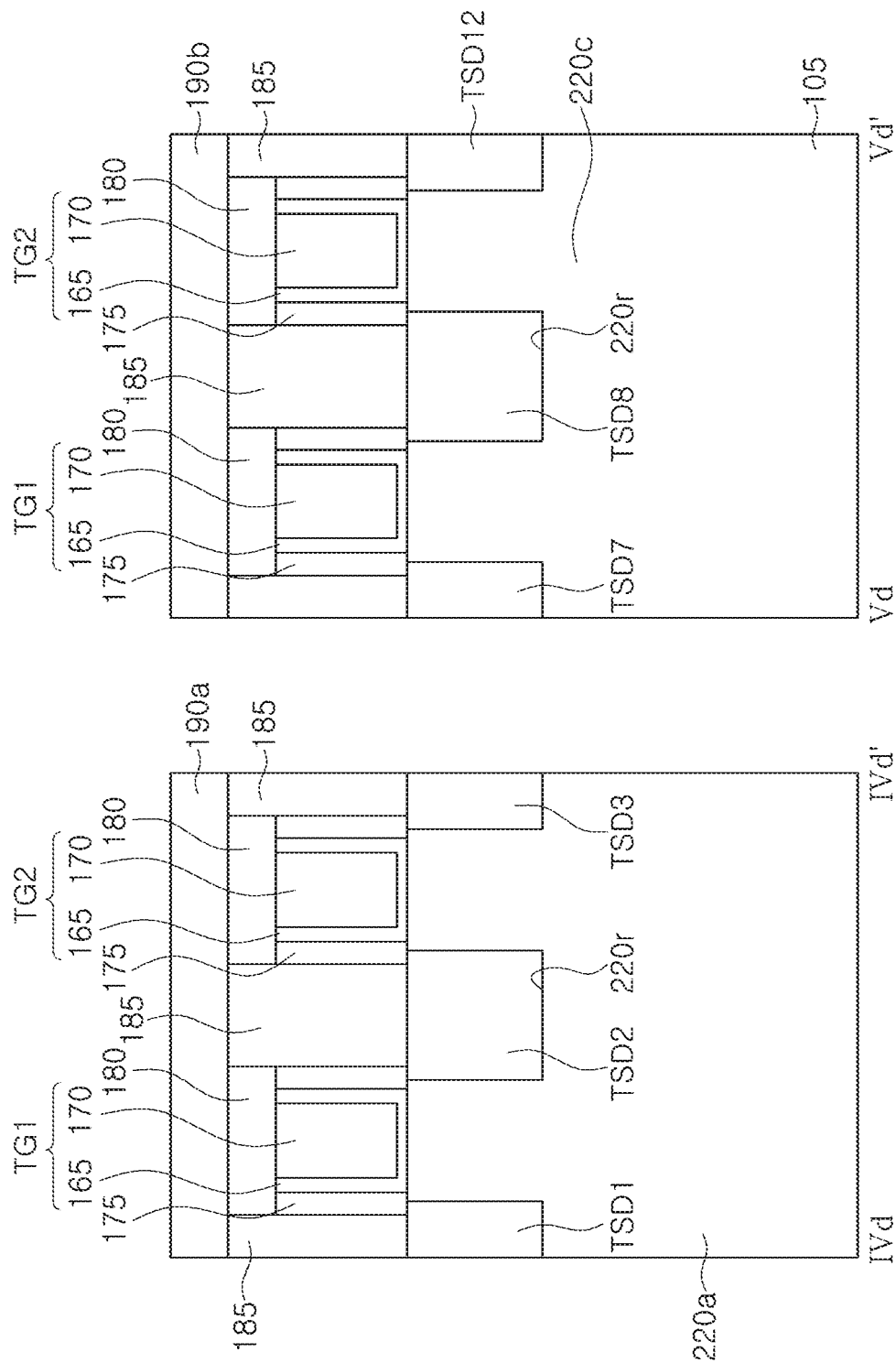

Next, with reference to FIGS. 21, 22A, and 22B, an example of a semiconductor device according to some example embodiments will be described. FIG. 21 is a plan view illustrating the unit test region UTC, FIG. 22A is a cross-sectional view illustrating a region taken along line IIId-IIId' of FIG. 21, and FIG. 22B is a cross-sectional view illustrating a region taken along line IVd-IVd' and line Vd-Vd' of FIG. 21. FIGS. 21, 22A, and 22B are drawings illustrating an example configured to apply a current or a voltage to test source/drain regions having different types of conductivity while opposing each other, in FIGS. 15, 16A, and 16B. Thus, hereinafter, while referring to the structure described with reference to FIGS. 15, 16A, and 16B, a wiring structure configured to or for applying a current or a voltage to test source/drain regions having different types of conductivity will be described. Thus, when described with reference to FIGS. 21, 22A, and 22B, detailed description of some components described with reference to FIGS. 15, 16A, and 16B will be omitted.

Referring to FIGS. 21, 22A, and 22B, together with FIGS. 15, 16A, and 16B, contact plugs 185 may be disposed on each of the first to twelfth test source/drain regions TSD1 to TSD12.

Wirings, connecting test source/drain regions arranged in a longitudinal direction of the test active lines, that is, the first horizontal direction X, may be provided. The wirings may include first to fourth wirings 190a, 190b, 190c, and 190d.

The first wiring 190a may overlap the first test source/drain region TSD1, the second test source/drain region TSD2, and the third test source/drain region TSD3, arranged in the first horizontal direction X on the pair of first test active lines 220a, and may be electrically connected to the first test source/drain region TSD1, the second test source/drain region TSD2, and the third test source/drain region TSD3 through the contact plugs 185.

The second wiring 190b may overlap the seventh test source/drain region TSD7, the eighth test source/drain region TSD8, and the twelfth test source/drain region TSD12, arranged in the first horizontal direction X on the third test active region 220c, and may be electrically connected to the seventh test source/drain region TSD7, the eighth test source/drain region TSD8, and the twelfth test source/drain region TSD12 through the contact plugs 185.

The third wiring 190c may overlap the ninth test source/drain region TSD9, the tenth test source/drain region TSD10, and the eleventh test source/drain region TSD11, arranged in the first horizontal direction X on the fourth test active region 220d, and may be electrically connected to the ninth test source/drain region TSD9, the tenth test source/drain region TSD10, and the eleventh test source/drain region TSD11 through the contact plugs 185.

The fourth wiring 190d may overlap the fourth test source/drain region TSD4, the fifth test source/drain region TSDS, and the sixth test source/drain region TSD6, arranged in the first horizontal direction X on the pair of second test active lines 220b, and may be electrically connected to the fourth test source/drain region TSD4, the fifth test source/drain region TSDS, and the sixth test source/drain region TSD6 through the contact plugs 185. A lower insulating layer 178 formed on the isolation region 130 and formed between the contact plugs 185 and an upper insulating layer 180 on the lower insulating layer 178 may be provided. A portion of the upper insulating layer 180 may extend on or cover the test gate structures TG1 and TG2.

As described previously, in the unit test region UTC, as compared with in the unit memory cell region UMC, more source/drain regions, opposing each other and having different types of conductivity, are placed, thereby providing test structures configured to or for evaluating leakage current characteristics or reliability between source/drain regions opposing each other and having different types of conductivity.

As set forth above, according to example embodiments of the present inventive concepts, a semiconductor device may include test structures configured to or for providing an optimal lower active region for application to circuit structures.

Moreover, a semiconductor device may include test structures configured to or for detecting whether there is a leakage current defect or a reliability defect between source/drain regions having different types of conductivity.

Embodiments are described herein with reference to cross-sectional and/or perspective illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing.

While example embodiments have been shown and described above, it will be apparent to those skilled in the art that modifications and variations could be made without departing from the scope of the present disclosure, as defined by the appended claims.

What is claimed is:

1. A semiconductor device, comprising:
   a semiconductor substrate; and
   a plurality of test structures on the semiconductor substrate,
   wherein the test structures comprise respective lower active regions protruding from the semiconductor substrate in a vertical direction and having different widths, and upper active regions protruding from the respective lower active regions in the vertical direction,
   wherein the respective lower active regions comprise first regions and second regions,
   wherein the first regions overlap the upper active regions and are between the second regions, wherein the second regions comprise outer regions, and inner regions between the outer regions, wherein the outer regions of the respective lower active regions have respective widths that are different from one another, wherein each of the respective widths is uniform throughout the outer regions, wherein the respective lower active regions comprise a same number of the upper active regions protruding therefrom between the outer regions having the respective widths that are uniform.

2. The semiconductor device of claim 1, wherein the inner regions of the respective lower active regions have a same width.

3. The semiconductor device of claim 1, wherein one of the outer regions of one lower active region of the respective lower active regions has an upper surface defining a first angle with a side surface thereof, wherein one of the outer regions of another lower active region of the respective lower active regions has an upper surface defining a second angle with a side surface thereof, and wherein the first angle is different from the second angle.

4. The semiconductor device of claim 1, wherein one of the outer regions of one lower active region of the respective lower active regions has an upper surface defining an acute angle with a side surface thereof, and wherein one of the outer regions of another lower active region of the respective lower active regions has an upper surface defining an obtuse angle with a side surface thereof.

5. The semiconductor device of claim 1, wherein each of the inner regions has a width that is greater than the respective width of each of the outer regions, and wherein the respective lower active regions are discontinuous among the test structures.

6. The semiconductor device of claim 1, wherein the test structures further include gate structures and source/drain regions, wherein the gate structures overlap the respective lower active regions and the upper active regions protruding therefrom, and wherein the source/drain regions are on the upper active regions, and are between the gate structures in plan view.

7. The semiconductor device of claim 6, wherein the source/drain regions comprise an epitaxial semiconductor layer extending from recess regions of the upper active regions.

8. The semiconductor device of claim 6, further comprising:

first isolation regions on the second regions of the respective lower active regions; and a second isolation region extending in the vertical direction along side surfaces of the respective lower active regions, and adjacent the upper active regions and the first isolation regions.

9. The semiconductor device of claim 8, wherein the upper active regions protrude in the vertical direction between the first isolation regions, and wherein the gate structures extend on upper surfaces and side surfaces of the upper active regions.

10. The semiconductor device of claim 1, further comprising:

a plurality of circuit structures on the semiconductor substrate, wherein the circuit structures comprise respective circuit lower active regions protruding from the semiconductor substrate in the vertical direction, and circuit upper active regions protruding from the respective circuit lower active regions, wherein a variance between the different widths of the respective lower active regions is greater than a variance between widths of the respective circuit lower active regions.

11. A semiconductor device, comprising:

a semiconductor substrate;

a plurality of test structures on the semiconductor substrate, wherein the plurality of test structures comprise:

lower active regions protruding from the semiconductor substrate in a vertical direction that is perpendicular to the semiconductor substrate, the lower active regions having different widths;

upper active regions protruding from each of the lower active regions in the vertical direction, the upper active regions extending in a first horizontal direction; and gate structures extending in a second horizontal direction that is perpendicular to the first horizontal direction, the gate structures having portions overlapping the lower active regions and the upper active regions, wherein each of the lower active regions comprises first regions overlapping the upper active regions, and second regions not overlapping the upper active regions, and wherein the second regions comprise outer regions, and inner regions between the outer regions; and a plurality of circuit structures on the semiconductor substrate, wherein the plurality of circuit structures comprise circuit lower active regions extending from the semiconductor substrate in the vertical direction, circuit upper active regions on the circuit lower active regions, and a circuit gate structure comprising portions that overlap the circuit lower active regions and the circuit upper active regions, wherein a variance between the different widths of the lower active regions of the plurality of test structures is greater than a variance between respective widths of the circuit lower active regions of the plurality of circuit structures, and wherein the lower active regions of the plurality of test structures are rectangular in shape.

12. The semiconductor device of claim 11, wherein at least one of the circuit lower active regions comprises an outer region having a width equal to a width of one outer region among the outer regions of the plurality of test structures.

13. The semiconductor device of claim 11, wherein:

the inner regions, of the lower active regions having the different widths, have respective first widths that are equal to each other; and the outer regions, of the lower active regions having the different widths, have respective widths that are uniform throughout the outer regions, are different from each other, and are less than the respective first widths; and the respective lower active regions are discontinuous among the test structures.

14. The semiconductor device of claim 11, wherein the outer regions, of at least two of the lower active regions having the different widths, have respective ends with different heights.

15. The semiconductor device of claim 11, further comprising a gate connection portion, wherein the plurality of test structures comprise a first test structure, wherein the first test structure comprises a first lower active region, first upper active regions extending from the first lower active region in the vertical direction, and first gate structures comprising portions overlapping the first lower active region and the first upper active regions, and wherein the gate connection portion electrically connects the first gate structures.

16. The semiconductor device of claim 11, wherein the each of the lower active regions comprises a same number of the upper active regions protruding therefrom.

17. The semiconductor device of claim 11, wherein at least one of the test structures is in a scribe lane region of the semiconductor device.

18. A semiconductor device, comprising:

a semiconductor substrate; and a plurality of test structures on the semiconductor substrate, wherein the test structures comprise respective lower active regions protruding from the semiconductor substrate in a vertical direction and having different widths, and upper active regions protruding from the respective lower active regions in the vertical direction, wherein the respective lower active regions comprise first regions and second regions, wherein the first regions overlap the upper active regions and are between the second regions, wherein the second regions comprise outer regions, and inner regions between the outer regions, wherein widths of the outer regions of the respective lower active regions are different, wherein each of the widths of the outer regions of the respective lower active regions is uniform throughout the outer regions, wherein the semiconductor device further comprises first isolation regions on the second regions of the respective lower active regions, wherein the semiconductor device further comprises a second isolation region extending in the vertical direction along side surfaces of the respective lower active regions, and adjacent the upper active regions and the first isolation regions, and wherein a width of the outer region is a horizontal length between an outermost first region and the second isolation region.

19. The semiconductor device of claim 18, wherein each of the outer regions extends in a first direction parallel to an upper surface of the semiconductor substrate and has a straight line shape, wherein a length of each of the outer regions in the first direction is greater than a width of each of the outer regions in a second direction, and wherein the second direction is perpendicular to the first direction and is parallel to the upper surface of the semiconductor substrate.

* * * * *